United States Patent
Hurrell et al.

(10) Patent No.: US 10,020,068 B2
(45) Date of Patent: Jul. 10, 2018

(54) MULTIPLEXER DISTORTION CANCELLATION

(71) Applicant: Analog Devices Global, Hamilton (BM)

(72) Inventors: Christopher Peter Hurrell, Cookham (GB); Rares Andrei Bodnar, Reading (GB); Pasquale Delizia, Newbury (GB)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/266,741

(22) Filed: Sep. 15, 2016

(65) Prior Publication Data

US 2018/0075925 A1    Mar. 15, 2018

(51) Int. Cl.
    *G11C 27/02*      (2006.01)
    *H03K 17/693*    (2006.01)

(52) U.S. Cl.
    CPC ........... *G11C 27/02* (2013.01); *H03K 17/693* (2013.01)

(58) Field of Classification Search
CPC .. H03K 17/693; H03K 17/04; H03K 17/6871; H03K 17/161; H03K 19/0008; H03K 19/17732; H03K 17/9621; H03K 5/00; H03K 3/01

USPC ........ 327/427, 551, 559; 341/110, 122, 155, 341/172

See application file for complete search history.

(56) References Cited

U.S. PATENT DOCUMENTS 8,416,105 B2 *   4/2013   Lai .................... H03M 1/1061
                                                             341/120
2014/0085117 A1   3/2014   Hurrell et al.

* cited by examiner

*Primary Examiner* — John Poos
(74) *Attorney, Agent, or Firm* — Schwegman Lundberg & Woessner, P.A.

(57) ABSTRACT

Distortion in a combined sample and hold circuit and multiplexer can be reduced by dividing the sample and hold circuit and the multiplexer up into main and compensation signal channels, and considering the total error signal that arises during an acquire phase across both the switches of the multiplexer and the input switches of the sample and hold stage as a single error signal that has to be compensated. This compensation is then achieved by causing the same error voltages to be induced in both the main and compensation channels of the whole MUX and sample and hold circuit, such that errors can be made to cancel, thus improving the performance of the stage.

31 Claims, 15 Drawing Sheets

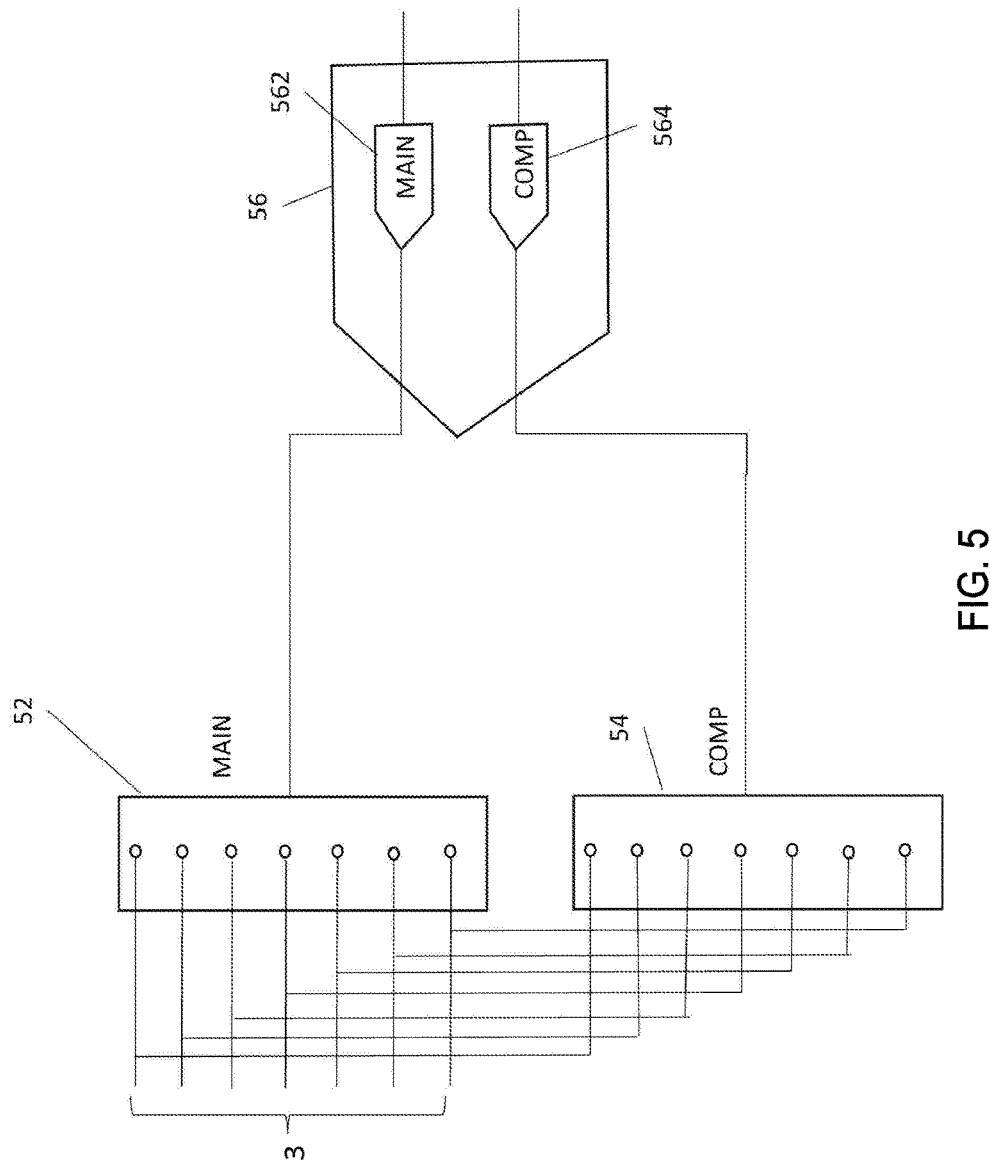

MULTIPLEXER DISTORTION CANCELLATION

FIELD OF THE DISCLOSURE

The present disclosure relates to techniques for reducing or cancelling distortion introduced into a signal by components of a multiplexer which acts to multiplex multiple input signals into another circuit.

BACKGROUND TO THE DISCLOSURE

Analog to Digital Converters (ADCs) are often preceded by a multiplexer (MUX), to allow analog signals from several different signal channels or lines to be multiplexed into the ADC for sampling and digital conversion. The non-linear capacitance of the off channels in the MUX (often as many as 15 or 31) can be a significant source of distortion, as well as the distortion due to non-linear on resistance of the switches in the MUX of the channel that is presently on. In this latter respect, when integrated with an ADC the MUX switches of each MUX channel will commonly take the form of transmission gates ("TG") which comprise a PMOS transistor in parallel with an NMOS transistor.

In use, when a "high" input voltage (Vin close to Vdd) is applied to the switch, there is little gate-source voltage (Vgs) across the NMOS transistor and it is largely switched off. However, under such circumstances there is a good gate-source voltage across the PMOS transistor, and it is fully conducting. Conversely, when a low (Vin close to Vss) input voltage is applied, there is little Vgs across the PMOS device and it is switched off, but conversely the NMOS device is driven hard on.

However, when the input voltage is mid range, both transistors may be conducting, but not to their lowest impedance state. Consequently the impedance of the TG switch may be at its largest "on" value ("Ron"). This non-linear Ron characteristic leads to distortion in the signal passing through the on channel of the MUX to the ADC with further distortion also being introduced by parasitic capacitances of the MUX channels.

SUMMARY OF THE DISCLOSURE

Distortion in a combined sample and hold circuit (which may be used as an input stage to an ADC) and multiplexer can be reduced by employing Main and Compensation signal channels, and considering the total error signal that arises during signal acquisition across both the switches of the multiplexer and the input switches of the sample and hold stage as a single error signal that has to be compensated. This compensation is then achieved by adapting the switches in the Compensation channel (for example by scaling the widths and/or parallel/series connection) with respect to the properties of the switches in the Main channel so that the total error charge in the Main and Compensation channel sampling capacitors is the same. By doing so error voltages induced in both the MUX and sample and hold circuits can be made to cancel, thus improving the performance of the stage. In addition, in a related technique distortion due to the off capacitance of switches in the MUX can also be compensated by the addition of additional capacitive load to the Compensation channel, the additional load introduces additional error voltages which cancel the error voltages introduced by the parasitic off capacitances of the switches. Additional distortion reducing techniques are also described.

In view of the above, from one aspect one example of the present disclosure presents a sampling circuit for sampling signals from multiple inputs. The sampling circuit comprises a sample and hold stage comprising main and compensation channels, the main and compensation channels including respective main and compensation input switches thereto, and respective main and compensation channel sampling capacitors. A multiplexer comprising a plurality of input nodes and a plurality of main switches is also provided, the main switches controlling signals in the main channel of the sample and hold stage. One or more compensation switches are also included, the one or more compensation switches controlling signals in the compensation channel of the sample and hold stage. Corresponding respective properties of the main and compensation switches in the combined MUX and sample and hold circuit are configured such that the same total error charges are generated in the main and compensation channel sampling capacitors. By having the same error charges in the sampling capacitors, then the errors may be reduced by appropriate processing of the respective signals.

For example, the error charges may in use substantially cancel one another. Hence, in order to obtain such cancellation, in one example the circuit may further comprise a differencing circuit arranged in use to receive a first error signal indicative of the total error charge in the main channel sampling capacitor and a second error signal indicative of the total error charge in the compensation channel sampling capacitor. The differencing circuit then subtracts one of the first or second error signals from the other to generate a substantially error free output signal.

In order to obtain balancing of the error charges in the main and compensation channels, in some examples the corresponding respective properties of the main and compensation switches in the combined MUX and sample and hold circuit are adapted such that the respective properties are related to each other in dependence on a first predetermined ratio. For example, in some examples the first predetermined ratio may be one of i) the number of compensation channels K in the sample and hold stage to the number of main channels J in the sample and hold stage; or ii) the total value of the sampling capacitor K in the main channel to the total value of the sampling capacitor J in the compensation capacitor.

In other examples the switches comprise transistors, and the corresponding respective properties are the transistor widths or in the case where series and/or parallel arrangement of switches are employed, the effective width, the widths or effective widths of the respective transistors forming the compensation switches in the sample and hold stage and the multiplexer being scaled with respect to the respective transistors forming the main switches in the sample and hold stage and the multiplexer by the first predetermined ratio.

In one example the respective main and compensation input switches in the sample and hold circuit and the respective main and compensation switches in the multiplexer are formed from respective arrays of switches. In a further example the arrays of switches are arrays of transistors, the numbers of transistors in the arrays being selected to meet a predetermined relationship that leads to cancellation of distortion due to on resistance of the transistors.

In one example embodiment a second multiplexer arranged to switch signals from the plurality of input nodes into the compensation channel is provided, and the compensation switches form part of the second multiplexer. In this example the main and compensation switches in the combined MUX and sample and hold circuit may be configured so as to meet the following criterion $$\left(\frac{J}{K}\right)^2 \cdot \left(\frac{E}{F} + \frac{A}{B \cdot J}\right) = \frac{G}{H} + \frac{C}{D \cdot K}$$

where:
J is the number of main channels in the sample and hold stage;
K is the number of compensation channels in the sample and hold stage;
F and E are the numbers of rows and columns respectively in the arrays of transistors forming the main sets of switches in the multiplexer;
H and G are the numbers of rows and columns respectively in the arrays of transistors forming the compensation sets of switches in the multiplexer;
B and A are the numbers of rows and columns respectively in the arrays of transistors forming the main sets of input switches in the sample and hold stage; and
D and C are the numbers of rows and columns respectively in the arrays of transistors forming the compensation sets of input switches in the sample and hold stage.

In another example the compensation switches switch signals from the output of the multiplexer into the compensation channel of the sample and hold stage. In this example the main and compensation switches in the combined MUX and sample and hold circuit may be configured so as to meet the following criterion:

$$\left(\frac{J}{K}\right)^2 \cdot \left(\frac{E}{F} + \frac{A}{B \cdot J}\right) - \frac{E}{F} = \frac{G}{H} + \frac{C}{D \cdot K}$$

where:
J is the number of main channels in the sample and hold stage;
K is the number of compensation channels in the sample and hold stage;
F and E are the numbers of rows and columns respectively in the arrays of transistors forming the main sets of switches in the multiplexer;
H and G are the numbers of rows and columns respectively in the arrays of transistors forming the compensation sets of switches in the multiplexer;
B and A are the numbers of rows and columns respectively in the arrays of transistors forming the main sets of input switches in the sample and hold stage; and
D and C are the numbers of rows and columns respectively in the arrays of transistors forming the compensation sets of input switches in the sample and hold stage.

Furthermore, in another example the arrays of switches are arrays of transistors, the numbers of transistors in the arrays being selected to meet a predetermined relationship that leads to cancellation of distortion due to current flows into parasitic capacitance between respective gates and channels of the transistors.

In more detail, in this example a second multiplexer may be configured to switch signals from the plurality of input nodes into the compensation channel. The compensation switches form part of the second multiplexer, and the main and compensation switches in the combined MUX and sample and hold circuit are configured so as to meet the following criterion:

$$\frac{J}{K} \cdot \left(\frac{(E^2 + A^2)}{2} + \frac{J \cdot A \cdot B \cdot E}{F}\right) = \left(\frac{(G^2 + C^2)}{2} + \frac{K \cdot C \cdot D \cdot G}{H}\right)$$

where:
J is the number of main channels in the sample and hold stage;
K is the number of compensation channels in the sample and hold stage;
F and E are the numbers of rows and columns respectively in the arrays of transistors forming the main sets of switches in the multiplexer;
H and G are the numbers of rows and columns respectively in the arrays of transistors forming the compensation sets of switches in the multiplexer;
B and A are the numbers of rows and columns respectively in the arrays of transistors forming the main sets of input switches in the sample and hold stage; and
D and C are the numbers of rows and columns respectively in the arrays of transistors forming the compensation sets of input switches in the sample and hold stage.

Alternatively, in another example the compensation switches switch signals from the output of the multiplexer into the compensation channel of the sample and hold stage. In this example the main and compensation switches in the combined MUX and sample and hold circuit are configured so as to meet the following criterion:

$$\frac{J}{K} \cdot \left(\frac{(E^2 + A^2)}{2} + \frac{J \cdot A \cdot B \cdot E}{F}\right) + \left(\frac{J}{K} - 1\right) \cdot (C \cdot D \cdot K + G \cdot H) -$$
$$\frac{E^2}{2} - \frac{E \cdot A \cdot B \cdot J}{f} = \frac{(G^2 + C^2)}{2} + \frac{K \cdot C \cdot D \cdot G}{H}$$

where:
J is the number of main channels in the sample and hold stage;
K is the number of compensation channels in the sample and hold stage;
F and E are the numbers of rows and columns respectively in the arrays of transistors forming the main sets of switches in the multiplexer;
H and G are the numbers of rows and columns respectively in the arrays of transistors forming the compensation sets of switches in the multiplexer;
B and A are the numbers of rows and columns respectively in the arrays of transistors forming the main sets of input switches in the sample and hold stage; and
D and C are the numbers of rows and columns respectively in the arrays of transistors forming the compensation sets of input switches in the sample and hold stage.

In a further example a capacitive load can be included on the output of the one or more compensation switches or elsewhere in the compensation channel, the capacitive load being of such a value that in use the capacitive load introduces additional error voltages that cancel error voltages arising from parasitic capacitances arising in switches in the multiplexer that are off.

In one example the capacitive load may be one or more transistors biased off. In such an example the transistor width can be adapted to give the desired capacitive load, or alternatively L transistors of uniform width W may be provided in parallel to give the desired load.

In one example where a capacitive load is provided, a second multiplexer arranged to switch signals from the plurality of input nodes into the compensation channel may be included, the compensation switches forming part of the second multiplexer. In this example the first and second multiplexers may be used as an input stage to a sample and hold stage having J main and K compensation channels, the width L then being given by:

$$L = (M-1) \cdot H \cdot \left(\frac{J}{K} \cdot \frac{E}{G} - 1\right)$$

where:
E is the number of columns in an array of transistors forming the main sets of switches in the multiplexer;
H and G are the numbers of rows and columns respectively in arrays of transistors forming the compensation sets of switches; and
M is the number of multiplexer channels.

In another example where a capacitive load is provided, the one or more compensation switches may receive the output of the multiplexer as an input therein, the multiplexer and the compensation switches then being used as an input stage to a sample and hold stage having J main and K compensation channels. In this case the width L is then given by:

$$L = (M-1) \cdot \left(\frac{J}{K} - 1\right) E \bigg/ \left(\frac{G}{H} - \left(\frac{E}{F}\right)\left(\frac{J}{K} - 1\right)\right)$$

where:
E is the number of columns in an array of transistors forming the main sets of switches in the multiplexer;
H and G are the numbers of rows and columns respectively in arrays of transistors forming the compensation sets of switches; and
M is the number of multiplexer channels.

From another aspect, another example of the present disclosure provides a multiplexing input stage, comprising a multiplexer having a plurality of input nodes and a plurality of main switches arranged to switch a signal presented on the input nodes to a first signal channel. One or more compensation switches are further provided, the one or more compensation switches being arranged to switch a signal input thereto to a second signal channel. The second signal channel has thereon a capacitive load of such a value that in use the capacitive load introduces additional error voltages into signals on the second signal channel that can be used to cancel error voltages on the first signal channel arising from parasitic capacitances arising in switches in the multiplexer that are off.

In one example the capacitive load is one or more transistors biased off, and capacitive value may be set by the transistor width being adapted to give the desired capacitive load. In one example, this may be accomplished by providing L transistors of uniform width W in parallel to give the desired load.

In one example there may further be included a second multiplexer arranged to switch signals from the plurality of input nodes into the second channel, the compensation switches forming part of the second multiplexer. In this example the first and second multiplexers may be used as an input stage to a sample and hold stage having J first and K second channels, the width L then being given by:

$$L = (M-1) \cdot H \cdot \left(\frac{J}{K} \cdot \frac{E}{G} - 1\right)$$

where:
E is the number of columns in an array of transistors forming the main sets of switches in the multiplexer;
H and G are the numbers of rows and columns respectively in arrays of transistors forming the compensation sets of switches; and
M is the number of multiplexer channels.

In an alternative or additional example the one or more compensation switches receive the output of the multiplexer as an input therein, the multiplexer and the compensation switches then being used as an input stage to a sample and hold stage having J first and K second channels, the width L then being given by:

$$L = (M-1) \cdot \left(\frac{J}{K} - 1\right) E \bigg/ \left(\frac{G}{H} - \left(\frac{E}{F}\right)\left(\frac{J}{K} - 1\right)\right)$$

where:
E is the number of columns in an array of transistors forming the main sets of switches in the multiplexer;
H and G are the numbers of rows and columns respectively in arrays of transistors forming the compensation sets of switches; and
M is the number of multiplexer channels.

From another aspect one example also provides a method for sampling signals from multiple input nodes, comprising: multiplexing signals from a plurality of input nodes to a sample and hold circuit stage via a plurality of multiplexer switches, the sample and hold stage comprising main and compensation channels, the main and compensation channels including respective main and compensation input switches thereto, and respective main and compensation channel sampling capacitors; in the sample and hold stage, switching, via the main and compensation input switches, input signals onto the main and compensation channel sampling capacitors for sampling; and sampling the input signals from the main and compensation channel sampling capacitors; wherein corresponding respective properties of the multiplexer switches and the main and compensation input switches in the combined MUX and sample and hold circuit are configured such that the same total error charges are generated in the main and compensation channel sampling capacitors.

Further features, example embodiments, and advantages of the present disclosure will be apparent from the following description and from the appended claims.

BRIEF DESCRIPTION OF THE DRAWINGS

Examples of the present disclosure will now be described with reference to the accompanying drawings, wherein like reference numerals refer to like parts, and wherein:—

FIG. 5 is a diagram of a first example of the present disclosure where distortion due to switch on resistance is reduced in a multiplexed sample and hold circuit by dividing the multiplexer into separate main and compensation channels;

DETAILED DESCRIPTION

Figure 1:
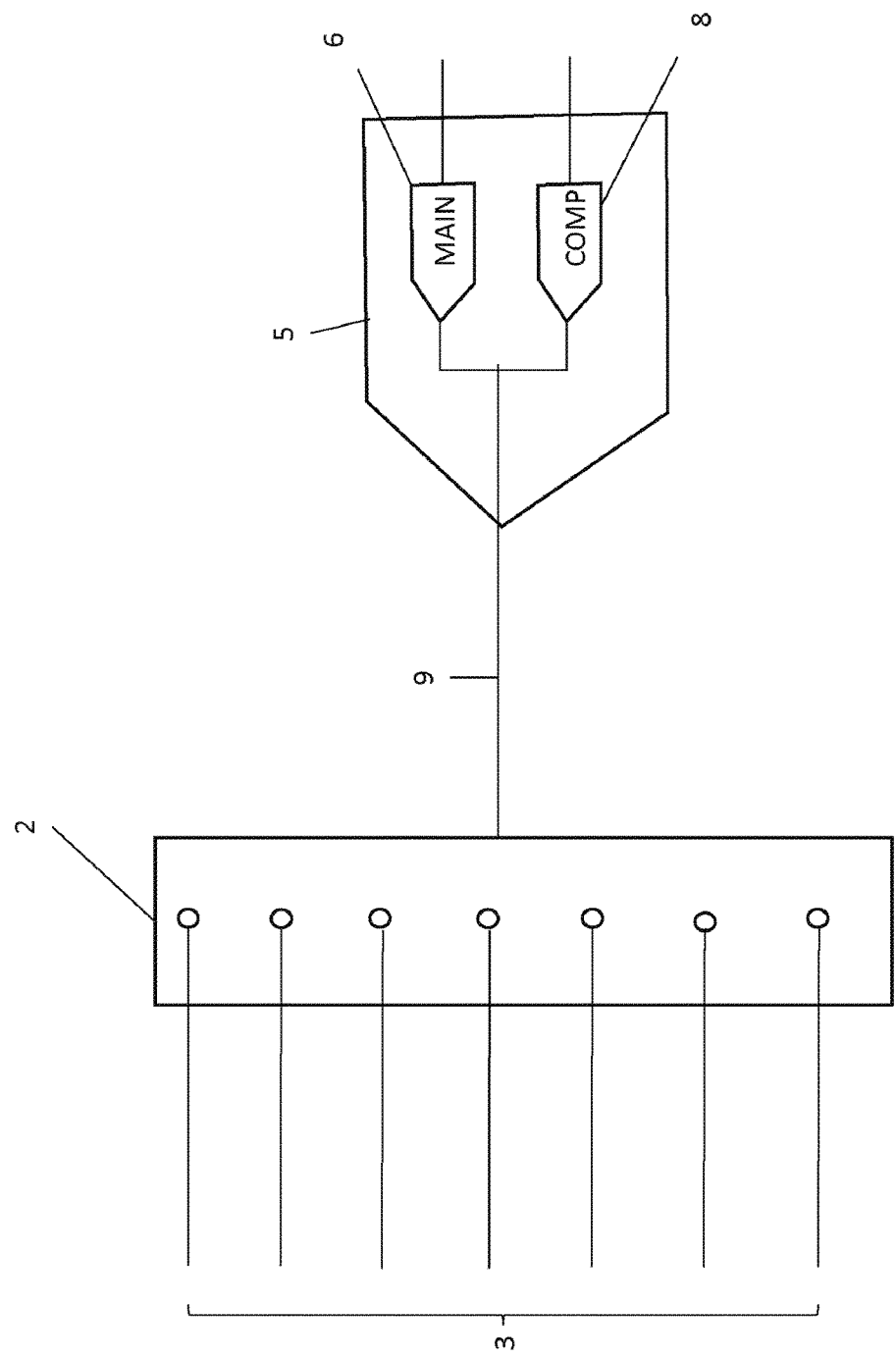
FIG. 1 is a diagram illustrating a background MUX and Sample and Hold (S/H) arrangement.

Several example embodiments will be described in detail below, which reduce distortion in a MUX input stage to a sample and hold circuit, either by addressing the distortion in the MUX arising from switch on resistance, by addressing the parasitic capacitance of switched off MUX channels, or by addressing the parasitic capacitance inherent in FET devices.

In a one example, distortion introduced by switch-on resistance is addressed by providing a sample and hold circuit which is divided into Main and Compensation channels, as described in the background, and which is provided with a MUX at the input thereof which itself is divided into Main and Compensation channels that correspond to the Main and Compensation channels of the sample and hold circuit. The device widths (and/or series/parallel connection) of switches that form the compensation channel in the combined MUX and sample and hold circuit are scaled relative to that of the Main channel so that the total error charge in the Main and Compensation channel sampling capacitors is the same. By doing so error voltages caused by on-resistance of the devices in the combined MUX and sample and hold circuit can be cancelled, in a similar manner to the cancellation of on-resistance induced error in just the sample and hold circuit With such measures, overall distortion in the combined MUX and S/H circuit can be reduced, in one example by as much as 17 dB.

In another example, distortion introduced by non-linear capacitance in the off channels of the MUX can be compensated. This may be accomplished by again dividing the MUX into main and compensation channels as in the first example (and thereby compensating for on-resistance with appropriately scaled switch devices in the MUX), and then adding an additional capacitive load on the output of the compensation channel MUX. The provision of the additional capacitive load generates error charges in the sampling capacitor of a connected sample and hold circuit which cancel any error charges arising from non-linear capacitances in the off channels of the MUX. A further 18 dB reduction in distortion has been obtained using such a technique.

In a further example, the error arising from voltage errors across turned on switches arising from currents flowing in to parasitic capacitances of switch gates and back-gates can be compensated. Again this is accomplished by arranging arrays of devices that form the switches of the MUX and the sample and hold circuit so that the compensation and main channel error voltages scale in the ratio of the number of compensation channels to the number of main channels or the value of the Compensation to Main sampling capacitors. By doing so, further reductions in distortion are obtained.

As variants on the above arrangements, instead of providing an entire set of MUX switches for the compensation channel capable of switching all the multiple inputs into the compensation channel, a single set of compensation switches corresponding to a single MUX channel is provided for the compensation channel, connected to the output of the main channel MUX. The Main channel MUX therefore switches the multiple inputs into the set of compensation switches as well as its own output, therefore doing away with the need for a whole compensation channel MUX. However, the set of compensation switches, which are always on, combine with the devices of the compensation channel in the same manner as described above where a whole compensation MUX is provided, to generate error voltages for the compensation channel which can be subtracted from the Main channel error voltages to cancel error signals therein.

The same change (i.e. replacing the Comp channel MUX with a single set of switches connected to the output of the Main channel MUX) can also be used with the other examples described above of reducing distortion introduced by non-linear capacitance in the off channels of the MUX, and reducing errors arising from parasitic capacitances of switch gates and back gates.

Turning now to the more specific examples to be described, FIGS. 1 to 4 illustrate in more detail the context of the example embodiments to be described. In this respect, FIG. 1 shows an arrangement where a multiplexer (hereafter shortened to MUX) 2 receives a number of signal input lines 3, and has internal switches that allow each input line to be connected to a single output line 9, which feeds into a sample and hold circuit 5. The sample and hold circuit 5 is of a type where distortion arising from the non-linear on-resistance of switches in the circuit 5 during an acquisition phase can be largely cancelled, by the provision of a Main sample and hold channel 6 and a Compensating (Comp) sample and hold channel 8. This arrangement will be described further below, with respect to FIG. 2.

Figure 2:
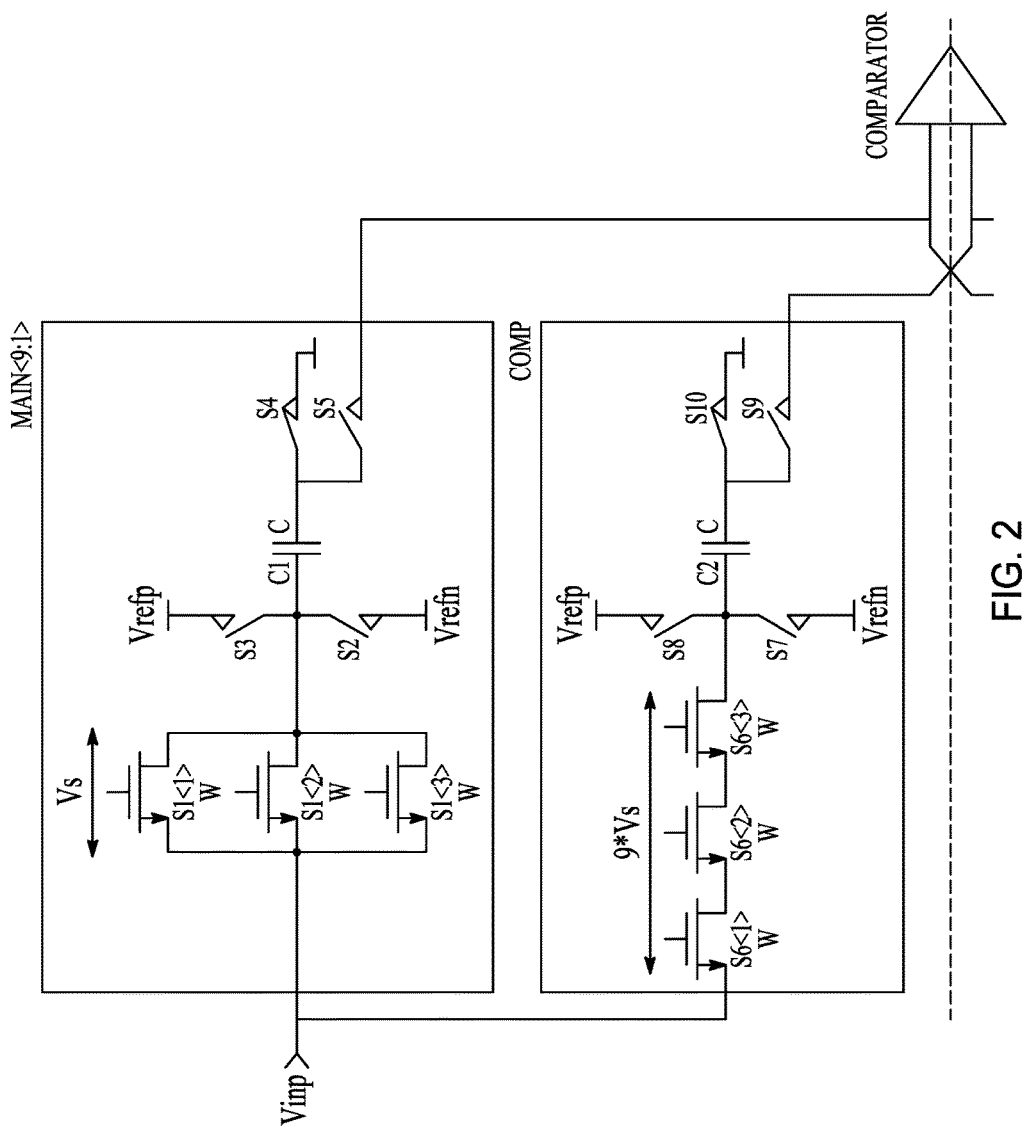
FIG. 2 is a circuit diagram illustrating a background sample and hold circuit.

FIG. 2 shows the sample and hold circuit 5, which may be, for example, the input stage to an ADC, and which is adapted to provide for distortion cancelling of the switch-on resistance of switches S1 and S6. In this respect, in this example, the switch S1 comprises 3 NMOS transistors each of the same width W connected in parallel, whereas the switch S6 comprises 3 NMOS transistors (each again of width W) connected in series. Note in this example there are 9 instances of the Main channel and just one instance of the Comp channel.

During acquisition, switches S1 and S6 are on, reference switches S2, S3, S7, and S8 are off and Right Hand Side [RHS] sampling switches S4 and S10 are on, while S5 and S9 are off. Consider the case where ADC input Vinp is driven with a sinusoidal voltage. The right hand side of C1 and C2 will remain at substantially zero volts while the left hand side [LHS] of C1 and C2 will be at substantially the ADC input voltage i.e. the sinusoidal voltage Vinp.

In order to sample the input signal Vinp on the main channels, considering just a single channel then current will have to flow through the input switch S1 to charge sampling capacitor C1, this current resulting in a small (non-linear) voltage Vs across the input switch S1 due to the device's finite (and non-linear) resistance. On the Comp channel, which has the same size capacitor as in each of the main channels, almost the same current will flow in and out of the capacitor C2 as in each of the main channels. However, in this case the current flows through 3 series NMOS devices forming the switch S6, rather than through the 3 parallel NMOS devices forming the switch S1. As the NMOS devices are operating in their linear region of operation the voltage developed across the Comp LHS switch will be 9 times greater than across each of the Main LHS switches. i.e. Vs6=9*Vs1

Turning to the sampling capacitors C1, and C2 in the Main and Comp channels, the total charge Qmain and Qcomp in the Main and Comp capacitors (given there are 9 Main channels) is given by $Q\_Main=9C*(Vinp-Vs)$ $Q\_Main=9C*Vinp-C*9Vs$ $Q\_Comp=C*(Vinp-9Vs)$ $Q\_Comp=CVinp-C*9Vs$ During the Conversion phase the Comp channel is switched by S9 through to the negative input of the comparator while the Main channel is switched by S5 through to the positive input of the comparator. This has the effect of subtracting the charge in the Comp channel from that in the Main channel so that the net charge Qnet in the input capacitor array is Q_main-Q_comp i.e.

$Q\_net=Q\_Main-Q\_Comp$ $Q\_net=9CVinp-C*9Vs-[C*Vinp-C*9Vs]$ $Q\_net=9CVinp-C*9Vs-C*Vinp+C*9Vs$ $Q\_net=8C*Vinp$ As will be seen from the above, the error term Vs that arises from the switch on resistance of the sampling switched S1 and S6 has been cancelled, at the cost of a reduction in the sampled signal charge from 9C*Vinp to 8C*Vinp. The particular arrangement of 3 parallel and 3 series devices in the Main and Comp channels is to ensure that current flowing into the gate or well of the input devices does not cause additional errors.

Hence, distortion arising from non-linear switch-on resistance in the sample and hold circuit 4, can be compensated for by the provision of separate Main and Compensation channels, together with choice of the number of devices comprising the sampling switches in the channels to give a cancellation of the switch on voltage Vs generated across the sampling switches during the acquisition phase, as current flows from the node being sampled into the hold capacitors in response to a changing input voltage.

As mentioned in the introduction, ADCs are often preceded by a multiplexer (MUX), to allow multiple signal channels to be switched into the ADC for conversion one at a time. The non-linear capacitance of the off channels in the MUX (often as many as 15 or 31) can be a significant source of distortion, as well as the distortion due to non-linear on resistance of the switches in the MUX of the channel that is presently on. In this latter respect, when integrated with an ADC employing transmission gate LHS sample switches, the MUX switches of each MUX channel will commonly also take the form of transmission gates, such as those shown in FIG. 3.

Figure 3:
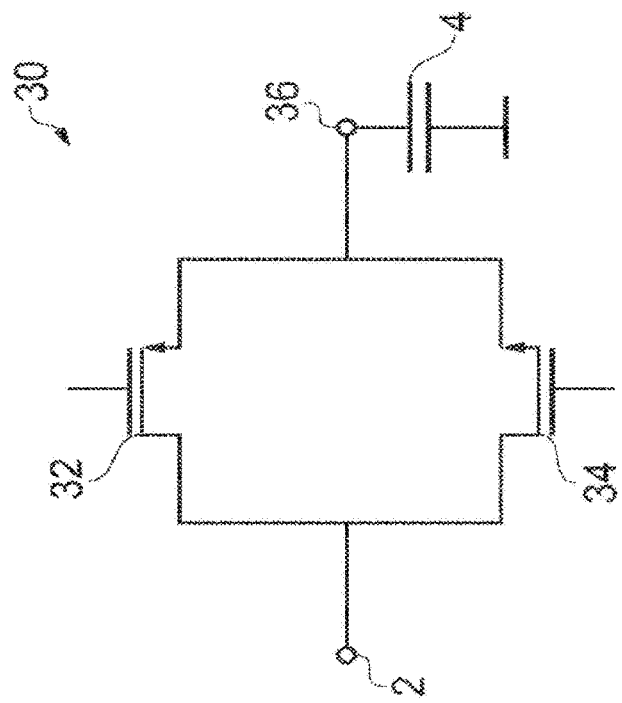
FIG. 3 is a circuit diagram of a typical transmission gate ("TG") structure.

The transmission gate ("TG") switch, generally designated 30, in FIG. 3 comprises a PMOS transistor 32 in parallel with an NMOS transistor 34. When it is desired to make the switch conducting the gate of the PMOS transistor 32 is taken to 0V (Vss) whereas the gate of the NMOS transistor 34 is taken to a suitable drive voltage, such as a positive supply voltage Vdd.

In use, because the TG is acting as a switch and hence should have little voltage drop the voltages at input node 2 and output node 36 should ideally be substantially the same. Therefore when a "high" input voltage (Vin close to Vdd) is applied to the switch, there is little gate-source voltage (Vgs) across the NMOS transistor 34 and it is largely switched off. However, under such circumstances there is a good gate-source voltage across the PMOS transistor 32, and it is fully conducting. Conversely, when a low (Vin close to Vss) input voltage is applied, there is little Vgs across the PMOS device and it is switched off, but conversely the NMOS device 34 is driven hard on.

Figure 4:
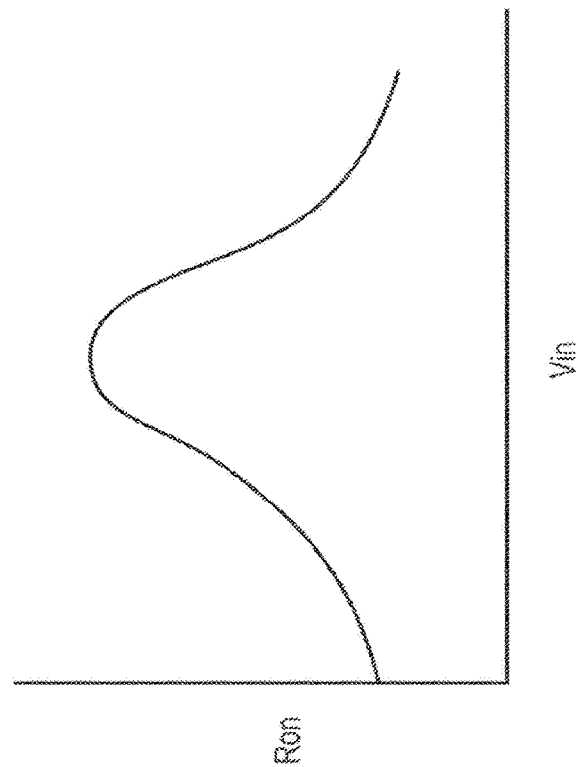
FIG. 4 is a graph of the Ron resistance against Vin of the TG structure of FIG. 3.

However, when the input voltage is mid range, both transistors may be conducting, but not to their lowest impedance state. Consequently the impedance of the TG switch may be at its largest "on" value. This problem is most prevalent where the supply voltage is low, say only a few volts. FIG. 4 schematically illustrates a variation of on resistance "Ron" versus input voltage Vin for a TG switch, from which it can be seem that the Ron is higher at mid-range levels of Vin, and lower at higher and lower levels either side. As noted above, this non-linear Ron characteristic leads to distortion in the signal passing through the on channel of the MUX to the sample and hold circuit 4, with further distortion also being introduced by parasitic capacitances of the MUX channels. Addressing either or both of these distortion mechanisms would improve MUX and associated ADC performance.

FIG. 5 therefore illustrates one example embodiment, which cancels or reduces Ron error in a combined MUX and sample and hold circuit. In this example a sample and hold circuit 56 (which may be part of an ADC) has a main circuit channel 562 and a compensation circuit channel 564. In order to give a performance improvement by compensating for multiplexer Ron then instead of a single multiplexer 2 being used to multiplex input signals into the sample and hold circuit, respective multiplexers 52 and 54 are provided corresponding to the separate Main and Comp channels 562 and 564. The inputs to the respective multiplexers are tied together to a common set of multiplexed inputs 3, so that the same input signal on one of the input channels 3 is fed at the same time to same respective input of the respective multiplexers 52 and 54. As described further below, the channel switches of the main and comp multiplexer channels are scaled with respect to each other in accordance with the same ratio (K/J) as the scaling applied to the input switches of the Main and Comp channels of the sample and hold circuit. Thus, for example, if the input switch of the main channels is of width W (or has a series/parallel combination of switches with effective width W), and the input switch of the compensation channel of width (W*K/J), where K is the number of compensation channels and J the number of main channels, then the switches in the multiplexer for the respective Main and Comp channels should scale by the same factors. By doing so the total error voltage across the combined MUX and sample hold circuit Compensation and Main channels scale by the ratio J/K and Ron distortion in the multiplexer switches can also be compensated.

Figure 6:
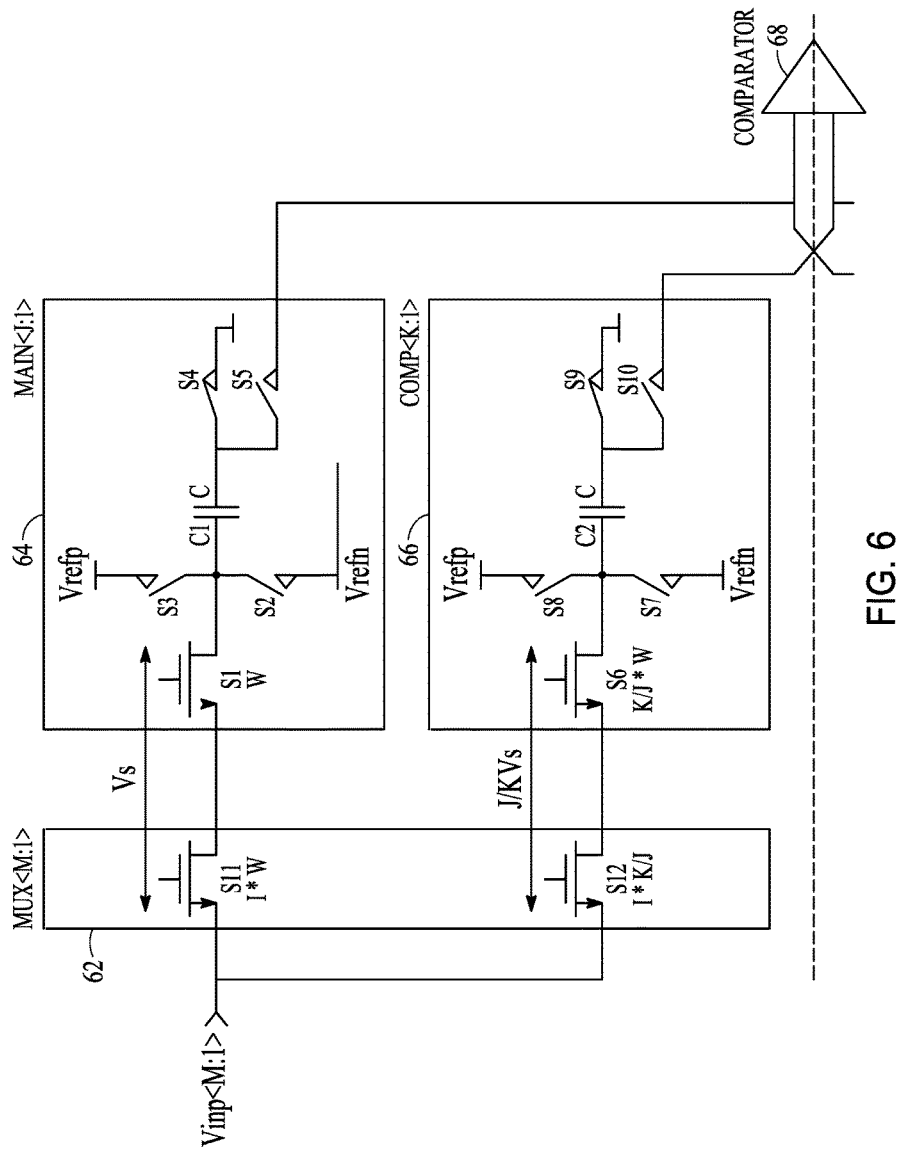
FIG. 6 is a circuit diagram of a multiplexer and sample and hold circuit of the first example.

FIG. 6 shows the concept in more detail applied to a combination of an ADC and a MUX. Here a MUX 62 consisting of M channels (although for clarity only 1 will be described) receives an input signal Vinp (again, there being M input signals, one for each MUX instance), which is fed to separate Main and Comp input switches S11 and S12 respectively, the switches in this instance being shown as single FETs both of width W scaled by a common scaling factor I, with the comp channel switch being further scaled by a second scaling factor K/J which allows for compensation of MUX error, as will be explained further below.

Looking at the Main channel 64, here J instances of the Main channel may be provided, with each instance comprising an input switch S1 of width W, formed by a FET. The output node of this FET is connected to a first plate of a capacitor C1, of capacitance C, with the same node also being connectable via switches S2 and S3 to two voltage reference sources Vrefn and Vrefp respectively during a conversion phase. The second plate of capacitor C1 may be switched via switch S5 to a first input of comparator 68 during a conversion phase, or switched by a second switch S4 to a local ground during an acquisition phase. Switches S4 and S5 operate in anti-phase to each other i.e. when S4 is on, S5 is off, and vice versa.

Turning to the comp channel 66, here K instances of the comp channel may be provided, with each instance having essentially the same form as the circuit of the main channels, but with the input switch width scaled proportionally to give the error compensation effect desired. That is, each instance comprises an input switch S6 of width W scaled by coefficient K/J, where K is number of comp channels and J the number of main channels; switch S6 is therefore formed by a FET of width W*K/J. The output node of this FET is connected to a first plate of a capacitor C2, of capacitance C, with the same node also being connectable via switches S7 and S8 to two voltage reference sources Vrefn and Vrefp respectively. The second plate of capacitor C2 may be switched via switch S10 to a second input of comparator 68, or switched by a second switch S9 to a local ground. Switches S9 and S10 operate in anti-phase to each other i.e. when S9 is on, S10 is off, and vice versa.

Note that in the above arrangement the Main and Comp channels now only combine at the Mux input. The LHS switches in each channel (i.e. S1 and S11 for the main channel and S6 and S12 for the comp channel) are not necessarily made from individual instances but can be thought of as a single device where the widths are scaled to ensure that the error voltage across the input switches in the Main and Comp channels scale in the ratio K/J so that the charge errors in the input capacitor array cancel during the conversion phase. To ensure that the error voltages across S11 and S12 in the MUX also cancel these devices are also scaled in the same ratio. An arbitrary scaling by I, as shown in the MUX is also allowable, depending on the MUX switch characteristics, and provided the same scaling I is applied to both Main and Comp MUX channel switches. It is possible that in some examples adjustments in the widths may have to be made from these ratios to take in to account errors arising when not using appropriately ratioed instances of identical devices in all the switches.

With the above arrangement and considering now the switch on voltage Vs that is generated by the combined Ron resistance of the switches S1 and S11 in both the sample and hold circuit and the MUX at channel switch-on, then the charge that arises in the capacitor C1 of the main channels is given by:

$$Q_{Main}=J.C.(Vinp-Vs)$$

$$Q_{Main}=J.C.Vinp-J.C.Vs$$

Looking at the comp channel, the MUX switch S12 and comp channel input switch S6 at switch on give a switch on voltage of J/KVs across their combined Ron, and hence the charge that arises in the capacitor C2 of the comp channels is given by:

$$Q_{Comp}=K.C.(Vinp-J/K.Vs)$$

$$Q_{Comp}=K.C.Vinp-J.C.Vs$$

To compensate for the error voltage Vs, then the respective charges on the main and the comp channel capacitors can be switched, via S5 and S10 respectively, to the respective inputs of a comparator, which acts to effectively subtract the comp charge from the main charge i.e.

$$Q_{net}=J.C.Vinp-J.C.Vs-(K.C.Vinp-J.C.Vs)$$

$$Q_{net}=(j-k).C.Vinp$$

From which it can be seen (cf Qnet) that the net error charge that gives Vs terms in the Main and Comp channels has cancelled. That is, the distortion that arises from the combined switch on resistance of both the switches in the sample and hold circuit and the MUX for each channel can be compensated and removed by scaling the MUX switches widths so as to be proportional to those of the input switches of the same respective channels of the sample and hold circuit, and subtracting the output of the compensation channels from those of the main channels in a comparator.

Figure 8:
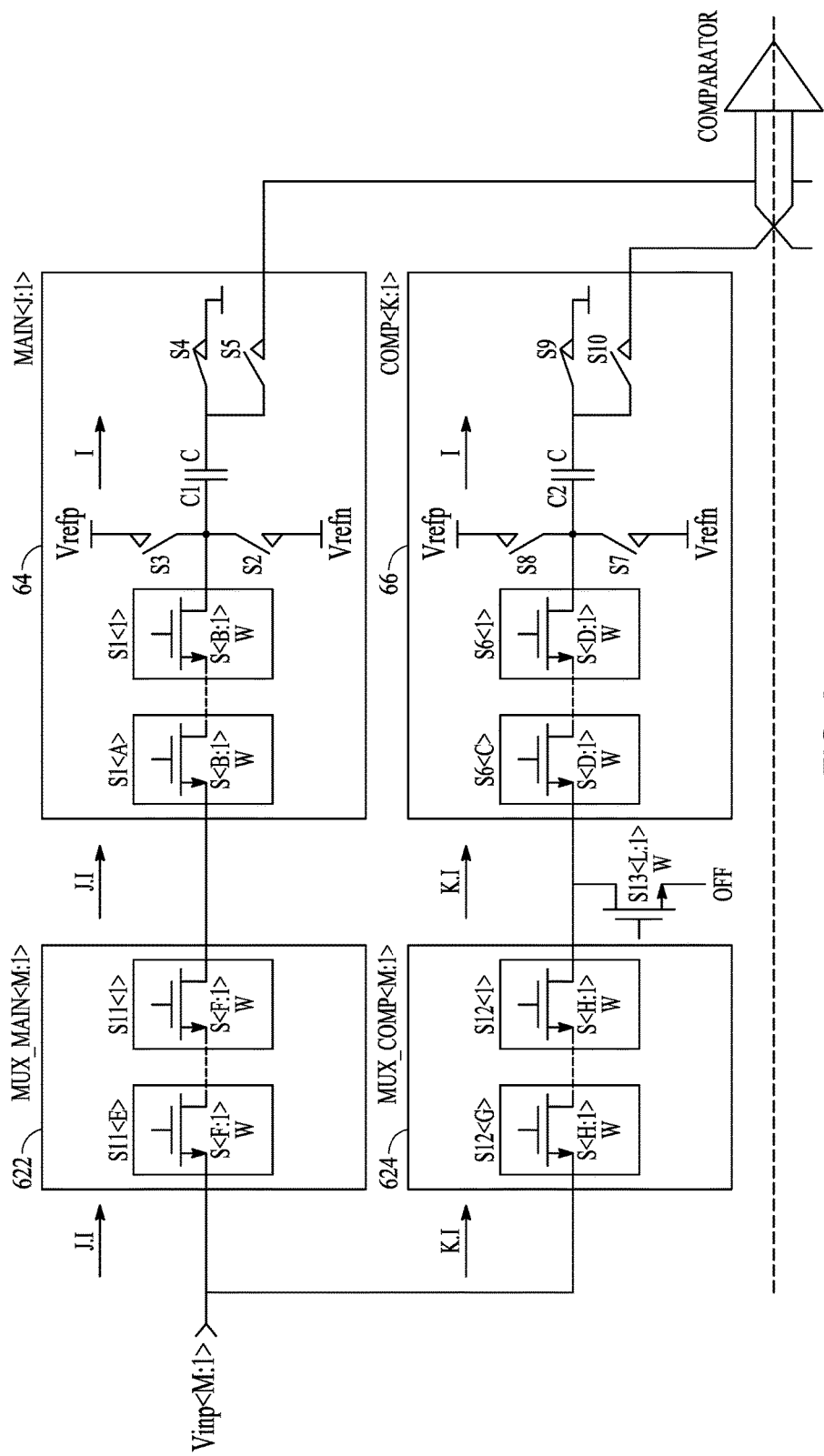
FIG. 8 is a circuit diagram of a generalised example of a MUX and S/H according to a generalised example of the present disclosure'

FIG. 6 described above illustrates one simple example where the switches S11, S1, and S12, and S6 are shown as formed from single switches, but this example may be generalised out to allow for the MUX switches S11 and S12 and the sample and hold input switches S1 and S6 to comprise respective arrays of switches, such as, for example, those arrays used in structures described previously. FIG. 8 shows such a generalized example of a combined MUX with switches constructed from multiple instances of identical devices.

In FIG. 8, the MUX switches S11 and S12 are represented by respective arrays of devices, with S11 being formed by an array of devices having F rows of series switches and E columns of parallel switches, and S12 being formed by an array of devices having H rows and G columns of switches. Similarly, the sample and hold input switches S1 and S6 are also formed from respective arrays, with S1 having D rows and A columns of devices, and S6 being formed from D rows and C columns of devices. All of the parameters A, B, C, D, E, F, G, and H are integer real numbers. The other elements of the circuit, and particularly the elements of the sample and hold circuit and the comparator remain as shown and described with respect to FIG. 6.

To consider the impact of this generalized arrangement let I be the current flowing in to each of the C1 and C2 capacitors and let us assume each switch has a resistance R.

Then the voltage Vmain across the Main MUX and ADC switches S11[F,E] and S1[B, A] is given by:—

$$Vmain = I \cdot \frac{A}{B} \cdot R + J \cdot I \cdot \frac{E}{F} \cdot R$$

Similarly for the comp channel the voltage Vcomp across the comp channel MUX and ADC input switches S12[H, G] and S6[D, C] is given by:—

$$VComp = I \cdot \frac{C}{D} \cdot R + K \cdot I \cdot \frac{G}{H} \cdot R$$

For the distortion components to cancel, as shown in the previous example Vcomp must be a factor J/K larger than Vmain, where J/K is the ratio of the number of Main channels to the number of Comp channels. Combining the above equations for Vmain and Vcomp in this ratio gives:—

$$Vcomp = J/K(Vmain)$$

Substituting in for Vmain and Vcomp and working through gives the result:

$$\left(\frac{J}{K}\right)^2 \cdot \left(\frac{E}{F} + \frac{A}{B \cdot J}\right) = \frac{G}{H} + \frac{C}{D \cdot K} \qquad \text{Equation 1}$$

That is, provided values are selected for each of the parameters A, B, C, D, E, F, G, H, J, and K which meet the above equation, then the distortion resulting from switch on resistance in the both the MUX and sample and hold switches can be compensated at the same time. To solve the equation values are chosen for some elements which are known to give good engineering results, and the remaining parameters can then be found. For example, as shown in FIG. 2, S1 can be formed by a parallel array of switches, which would give A=1 and B=3, whereas S6 may be formed from a series array of switches which would give C=3, and D=1. Example values for each of the parameters are given later.

Figure 13:
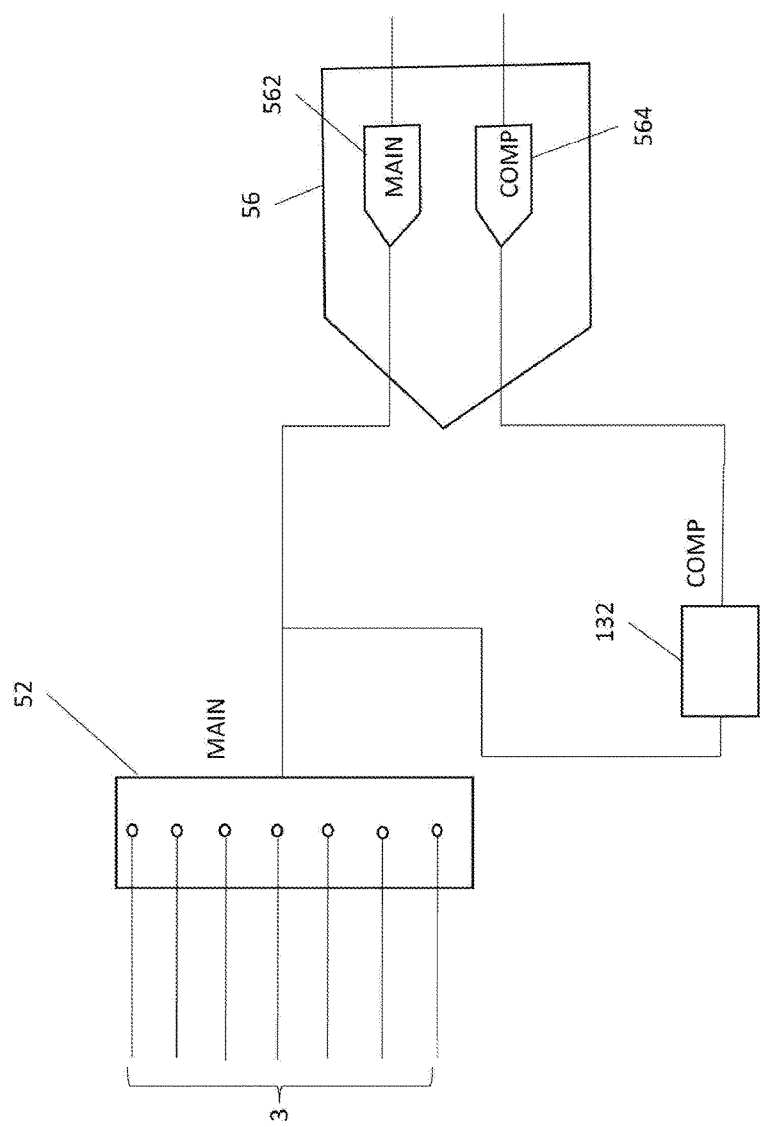
FIG. 13 is a diagram of a further example of the present disclosure.
Figure 14:
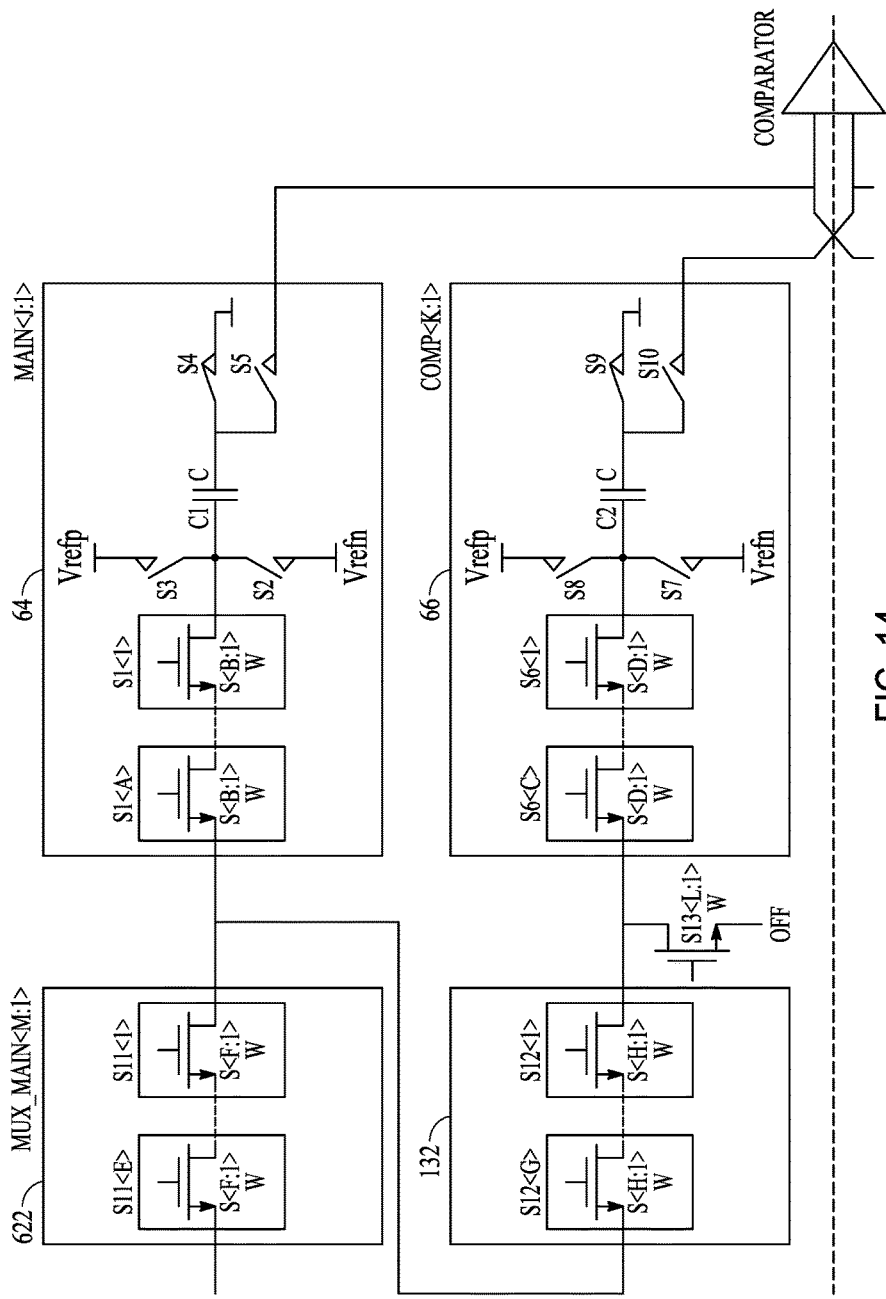
FIG. 14 is a more detailed circuit diagram of the example of FIG. 13.

In this analysis the widths and lengths of the devices in the MUX and ADC have been kept the same, however this is not a requirement, and in other examples the width W and lengths L of the devices can be varied, with W and L being included in the above analysis by considering that switch resistance R, for a device operating in its linear region, is proportional to L/W. In general best device matching is achieved by using instances of identical devices and for this reason it has not be felt necessary to expand the analysis to include the use of devices of variable widths and lengths A variant of this first example is shown in FIGS. 13 and 14. Here, as above, a sample and hold circuit 56 (which may be part of an ADC) has a main circuit channel 562 and a compensation circuit channel 564. In this example a single multiplexer 52 is provided as an input to the sample and hold circuit, having a set of input ports 3 switched to a single output. The output of the multiplexer is fed to the main circuit channel 562 in the sample and hold circuit, and also in this example to the compensation circuit channel 564 via a set of compensation switches 132. The set of compensation switches are the equivalent of a single channel set of multiplexer switches i.e. the multiplexer switches for one of the multiplexer channels, and in operation can be always on. The purpose of the set of compensation switches 132 are again to introduce additional error voltage into the Compensation channel to compensate for additional Ron error introduced into the Main channel by the multiplexer 52, but instead of requiring a whole Compensation multiplexer, because the input to the compensation switches 132 is itself multiplexed by the main channel multiplexer 52 (622 in FIG. 14) then no multiplexing functionality is required, and all that is needed is a single switch that emulates the presently switched on multiplexer switch, in order that the Main and Comp channels have appropriately scaled errors.

FIG. 14 illustrates the concept in slightly more detail, where it can be seen that the Main channel comprises a multiplexer having M channels, with each channel comprising a switch array of F rows by E columns of transistor switches, each transistor of the same width W. The output of the multiplexer is fed into the Main channel sample and hold circuit 64, and also into a single compensation array of switches 132, having H rows and G columns, provided at the input of the Compensation channel sample and hold circuit 66. Comparing FIG. 14 with FIG. 8 described above, it will be seen that the single set of switches 132 replaces the need for a whole compensation MUX, and hence component count and hence chip space is reduced.

In terms of how this variant operates, the operation is essentially the same as in the previously described example, in that Vcomp must still be a factor J/K larger than Vmain, where J/K is the ratio of the number of Main channels to the number of Comp channels, in order for the error components in both the Main and Comp channels to cancel. However, to accommodate the change in connections and that only a single set of compensation switches are provided (i.e. only a single channel's worth, in the form of the H by G array of transistors 132) the equation 1) above is adapted to the following:

$$\left(\frac{J}{K}\right)^2 \cdot \left(\frac{E}{F} + \frac{A}{B \cdot J}\right) - \frac{E}{F} = \frac{G}{H} + \frac{C}{D \cdot K} \qquad \text{Equation 1'}$$

Again, example values for each of the parameters are given later.

Figure 9:
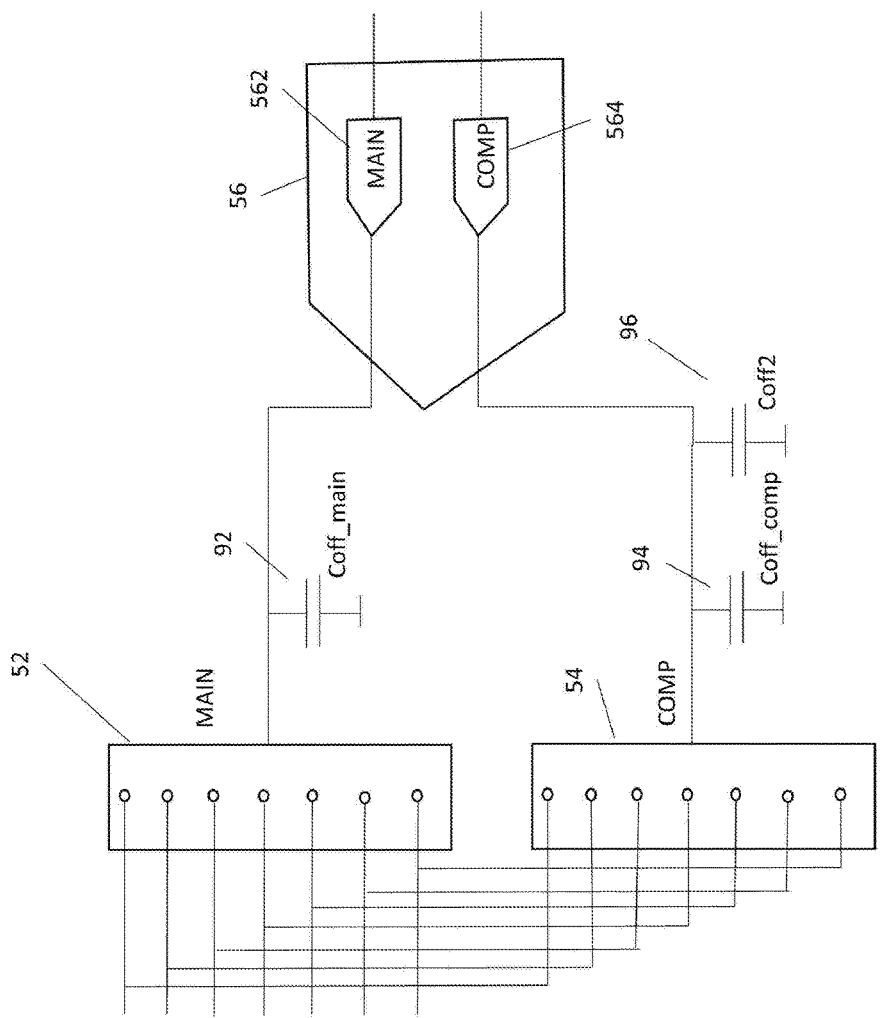
FIG. 9 is a diagram of a third example of the present disclosure where distortion from non-linear capacitances in switched off channels in a MUX is compensated by the provision of a compensation capacitive load.

Another example embodiment will now be described, which is for the cancellation of error arising from non-linear capacitance at MUX outputs In more detail, another source of distortion error in a MUX input stage to a sample and hold circuit comes from non-linear parasitic capacitances of the off-channels of a MUX. In this respect, at any one time when in operation a MUX will typically have a single "on" channel, being the channel that is being switched through from one of the multiple inputs to the output, and multiple "off" channels, being the remainder of the MUX channels that are not presently switched through to the output. As shown in FIG. 9, these "off" channels introduce non-linear parasitic capacitances Coff_main and Coff_comp (92, 94) at the respective outputs of the Main and Comp channels. During acquisition, current that flows through the MUX to charge Coff_main and Coff_comp (92,94) to a changing MUX input voltage causes a small but potentially significant error voltage across the MUX.

In order to address this problem, in the present example an additional capacitive load Coff2 96 is added to the MUX compensation channel output. The size of Coff2 is chosen so that the error charges that arise in the switches of the Main and Comp channels due to the parasitic capacitance of the MUX turned off devices can be cancelled, thus reducing any distortion introduced by the MUX off channel parasitic capacitance. In this respect, in order to achieve this effect, the value of Coff2 should again be chosen in dependence on the ratio of the number of main channels J to the number of compensation channels K.

Figure 10:
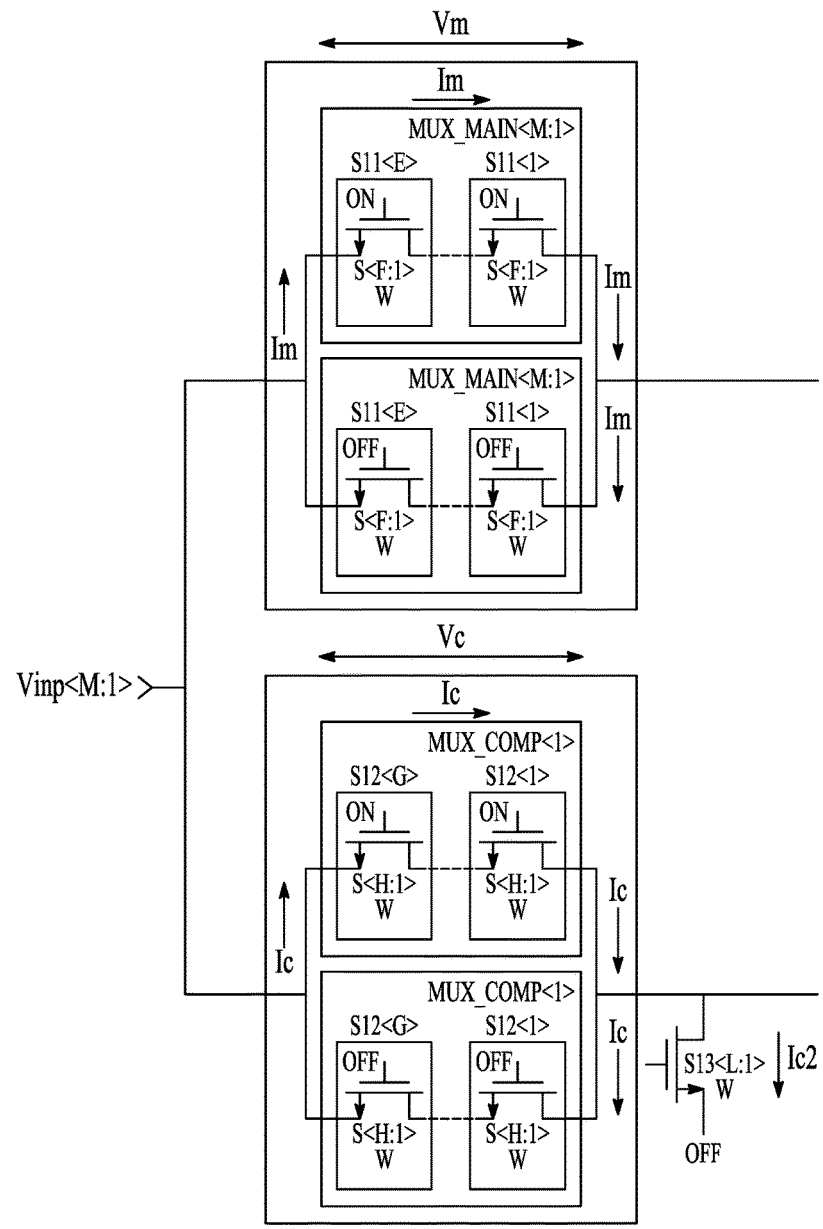
FIG. 10 is a circuit diagram of a MUX according to the third example, where a compensation capacitance is included.

In more detail, FIG. 10 shows the Mux_main and Mux_comp channels of FIG. 8 expanded to show the on channels and off channels separately (recalling the T-gate structure described previously in respect of FIG. 3). For the voltages across the Comp MUX and Main MUX to scale in the ratio J/K, account needs to be made of the currents flowing in the parasitic capacitance of the off devices at the output of the MUXs. For this correct scaling, one or more extra turned-off load devices S13 (or parasitic capacitance) have to be added to the output of the Comp MUX. That is, by adding the extra load devices S13 at the output of the comp channels, the additional parasitic capacitance represented by these devices can be used to compensate the parasitic capacitances of the off devices in the MUX.

To illustrate the above, let the current flowing into each individual turned off MUX device be Ip, then the currents flowing in to both the turned off MUX switches and the additional device S13, respectively Im, Ic1 and Ic2 are given by:—

$$Im = (M-1) \cdot F \cdot Ip$$

$$Ic1 = (M-1) \cdot H \cdot Ip$$

$$Ic2 = L \cdot Ip$$

With the resistance of each switch equal to R then the voltages across the main and comp MUX channels, Vm and Vc are:—

$$Vm = Im \cdot \frac{E}{F} \cdot R$$

$$Vc = (Ic1 + Ic2) \cdot \frac{G}{H} \cdot R, \text{ given } Ic = Ic1 + Ic2$$

and $$\frac{Vc}{Vm} = \frac{J}{K}$$

Substituting the expressions for Im, Ic1, and Ic2 into those for Vm and Vc, and solving for L in accordance with the ratio Vc/Vm=J/K gives:

$$L = (M-1) \cdot H \cdot \left(\frac{J}{K} \cdot \frac{E}{G} - 1\right) \quad \text{Equation 2}$$

Where L is the number of turned off parallel devices of width W of the compensation device S13 being added. Hence, sizing S13 accordingly will ensure that the voltage drop across the Main and Comp MUXs will generate errors charges in the sampling capacitor that will cancel during the conversion. Adding S13 has shown in simulation an improvement of 18 dB in distortion from 102 dB to 120 dB compared to not adding it. With all distortion cancelling disabled i.e. not compensating for error in the MUX switches at all, distortion degrades to 85 dB (25 kHz 5V pk-pk signal). While the optimum place to add turned off devices (or extra capacitance) is at the Comp MUX output, with appropriate adjustment its value, this extra capacitance can be added anywhere along the compensation path.

In terms of examples values for the parameters in the above Equation 2, specific example value sets are set out later.

Figure 15:
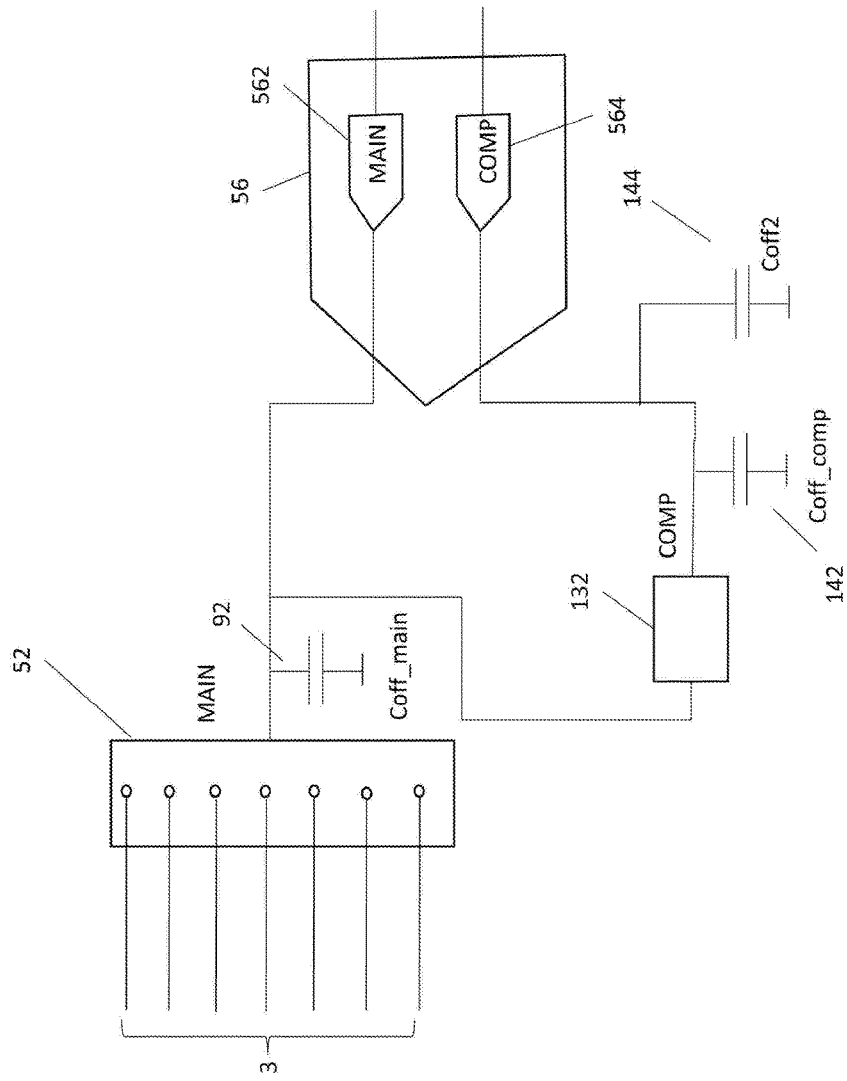
FIG. 15 is a diagram of a yet further example of the present disclosure.
Figure 16:
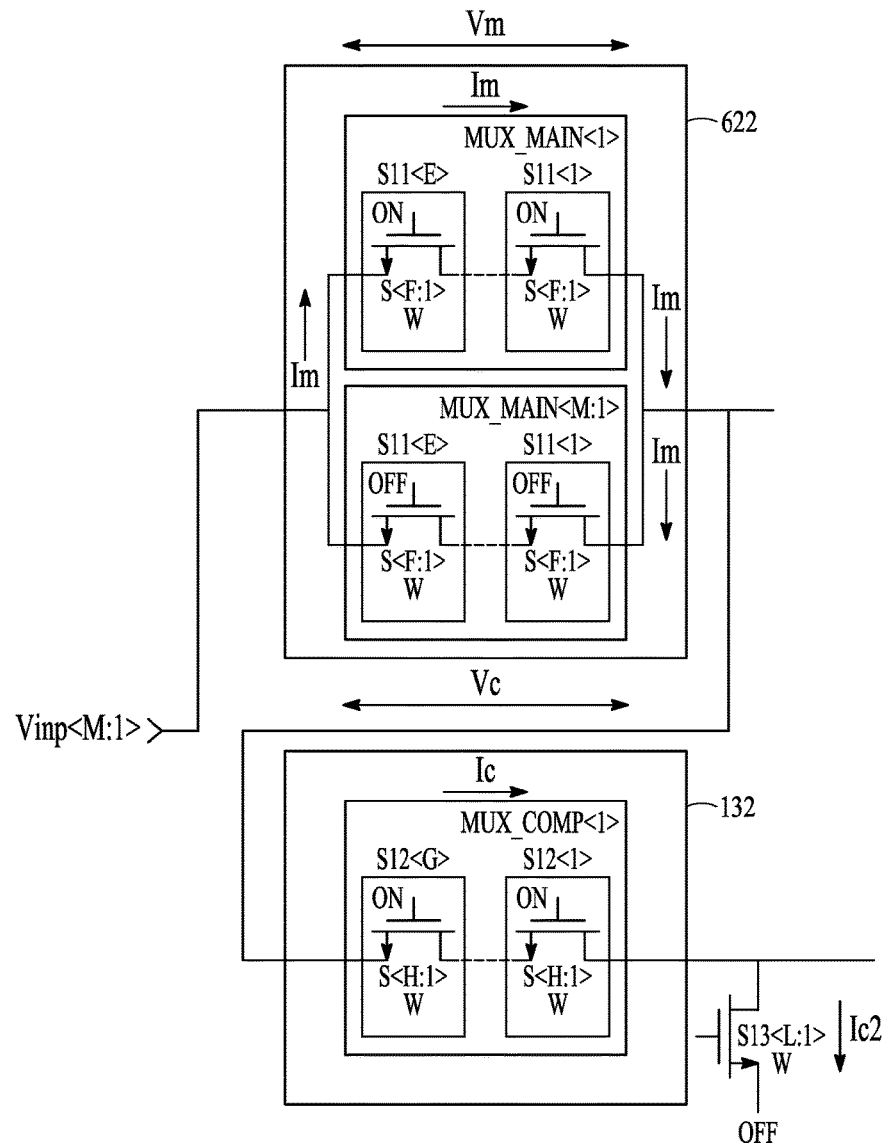
FIG. 16 is a more detailed circuit diagram of the example of FIG. 14.

As with the first example above, a variant of this second example does away with a whole Comp channel multiplexer in favor of just a single set of compensation switches connected to the output of the Main channel multiplexer, as shown in FIGS. 15 and 16. Here, instead of the compensation MUX described above, a single set of Compensation switches 132 is provided, connected to the output of the Main channel MUX. These compensation switches are always on, and hence there will are no "off" channels in the compensation set of switches 132 to introduce parasitic capacitance. However, the input to the compensation set of switches 132 is from the output of the Main channel MUX 52, which does have off channels which carry parasitic capacitance. The effects of this parasitic capacitance in the Main channel MUX are therefore imported, by the connection of the compensation set of switches 132 to the output of the MUX 52, into the compensation channel, such that in fact additional compensation capacitance Coff2 144 is needed after all (see FIG. 15). As shown in FIG. 16, this additional compensation capacitance can be provided by L turned off transistor devices S13, each of the same width W as the devices forming the compensation array of switches 132.

With this change, Equation 2 above becomes:
Equation 2 becomes $$L = (M-1) \cdot \left(\frac{J}{K} - 1\right) E \Big/ \left(\frac{G}{H} - \left(\frac{E}{F}\right)\left(\frac{J}{K} - 1\right)\right) \quad \text{Equation 2'}$$

Example parameter value solution sets that meet the above are given later.

A further example embodiment that provides for the cancellation of error arising from currents flowing in to switch gates and back-gates will now be described.

In particular, this example allows for error that arises from current flows into the parasitic capacitance that exists between the gate and the channel when a switch device (such as the switches S11 and S12 in the MUX, and/or the switches S1 and S6 in the sample and hold circuit). Again this is achieved by parameters of the circuit being selected so that errors introduced by the parasitic capacitances between the gate and the channel on switch on can be cancelled.

Figure 11:
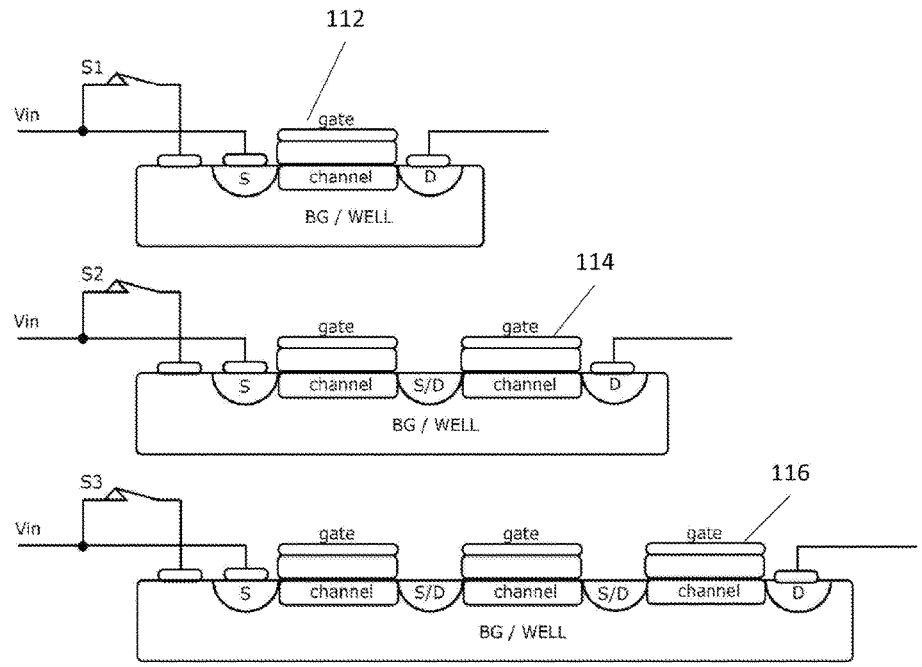
FIG. 11 is a diagram showing example transmission gate structures.

In more detail, FIG. 11 shows one, two and three switches (S1, S2, and S3) in series (112; 114; 116). In all three examples the back-gate (well) is driven by Vin (through S1-3). There is a capacitance associated with both the source-drain (S/D) and channel regions to the back-gate. In the case where the devices are well turned on, the back-gate voltage will closely track the S/D diffusion and channel voltages and hence very little current will flow into these capacitances (in the case of either a DC or dynamic input). For this reason these capacitances are ignored in this discussion. The gates however are most likely tied to a fixed voltage.

Figure 12:
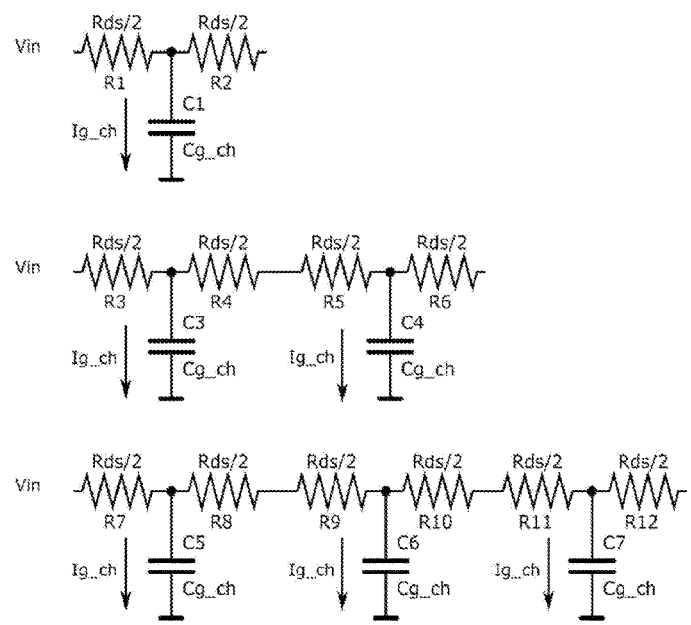
FIG. 12 is a diagram showing equivalent circuits to the example transmission gate structures of FIG. 11.

In the case of a dynamic input the voltage between the channel and the gate of each device will change; and current will flow in to the gate capacitance. This capacitance is shown as Cg_ch in the equivalent circuits shown in FIG. 12. Since the voltage across the switches is very nearly Vin, almost the same current Ig_ch will flow in to each capacitor Cg_ch. In the case of a single switch Ic1 only flows through R1, creating a voltage across the switch of Ig_ch*Rds/2. In the case of 3 switches in series, the current flowing in to, for example, C7 flows through 5 resistors R7-11 giving a voltage across the switch of Ig_ch*5Rds/2. The resulting voltage across the 3 switches due to the currents flowing in to all the gate capacitances is given by:—

$$V1 = 1.Ich\_g.Rds/2$$

$$V2 = 4. Ich\_g.Rds/2$$

$$V3 = 9.Ich\_g.Rds/2$$

In general it can be shown, by considering the sum of a geometric series, that the voltage across N series switches is given by:—

$$V\text{switch} = N^2.Ig\_ch.Rds/2$$

Referring back to FIG. 8, we have E series switches in the main Mux (S11) and A series switches in the main ADC (S1). The voltage Vmux and Vadc across the MUX and ADC series switches due to their own gate capacitances is therefore given by:—

$$Vmux_{main} = E^2 \cdot \text{Ig\_ch} \cdot Rds/2$$

$$Vadc_{main} = A^2 \cdot \text{Ig\_ch} \cdot \frac{Rds}{2}$$

It is also necessary to consider the voltage Vmux_adc which arises across the mux (i.e. across S11) due to the current flowing through the mux to drive the gate capacitances of the switches in the ADC. This is given by:—

$$Vmux\_(adc\_main) = J.(A.B).Ig\_ch.(E/F).Rds$$

The total error voltage across the switches in the main channel is then given by the sum of these three errors i.e.

$$V\text{main} = Vadc\_\text{main} + Vmux\_\text{main} + Vmux\_(adc\_\text{main})$$

Similar expressions can be derived for the compensation channel error voltages as follows:

$$Vmux_{comp} = G^2 \cdot \text{Ig\_ch} \cdot Rds/2$$

$$Vadc_{comp} = C^2 \cdot \text{Ig\_ch} \cdot \frac{Rds}{2}$$

$$Vmux\_(adc\_comp) = K \cdot (C \cdot D) \cdot \text{Ig\_ch} \cdot (G/H) \cdot Rds$$

And summing these to give the total comp channel error:

$$V\text{comp} = Vadc\_\text{comp} + Vmux\_\text{comp} + Vmux\_(adc\_\text{comp})$$

For these errors in the main and compensation paths to cancel then as before the compensation and main channel error voltages must also scale in the ratio J/K. i.e.

$$V\text{comp} = J/K(V\text{main})$$

Substituting in and working through gives the following resulting relationship that must then be satisfied to allow the cancellation of errors arising from current flowing in to gate capacitances.

$$\frac{J}{K} \cdot \left( \frac{(E^2 + A^2)}{2} + \frac{J \cdot A \cdot B \cdot E}{F} \right) = \left( \frac{(G^2 + C^2)}{2} + \frac{K \cdot C \cdot D \cdot G}{H} \right) \quad \text{Equation 3}$$

That is, values should be selected for the parameters A, B, C, D, E, F, G, H, K, and J, which meet the above condition, in order to cancel errors arising from gate capacitances. In this respect, the widths of the devices in the MUX and ADC have been kept the same, however this is not a requirement, and different widths may be used for different switches, with appropriate scaling of the above coefficients accordingly. In practice, it is expected that engineering values would be substituted for some of the values, as discussed previously, with the remainder then being solved for.

Again, as with the first and second examples above, a variant of this third example does away with a whole Comp channel multiplexer in favor of just a single set of compensation switches connected to the output of the Main channel multiplexer, as shown in FIGS. 15 and 16. Applying the above analysis relating to gate-channel parasitic capacitances but allowing for this difference in connection means that Equation 3 above becomes:

$$\frac{J}{K} \cdot \left( \frac{(E^2 + A^2)}{2} + \frac{J \cdot A \cdot B \cdot E}{F} \right) + \left( \frac{J}{K} - 1 \right) \cdot (C \cdot D \cdot K + G \cdot H) - \quad \text{Equation 3'}$$

$$\frac{E^2}{2} - \frac{E \cdot A \cdot B \cdot J}{F} = \frac{(G^2 + C^2)}{2} + \frac{K \cdot C \cdot D \cdot G}{H}$$

with example values for parameters A to K that give the above being discussed below.

Figure 7:
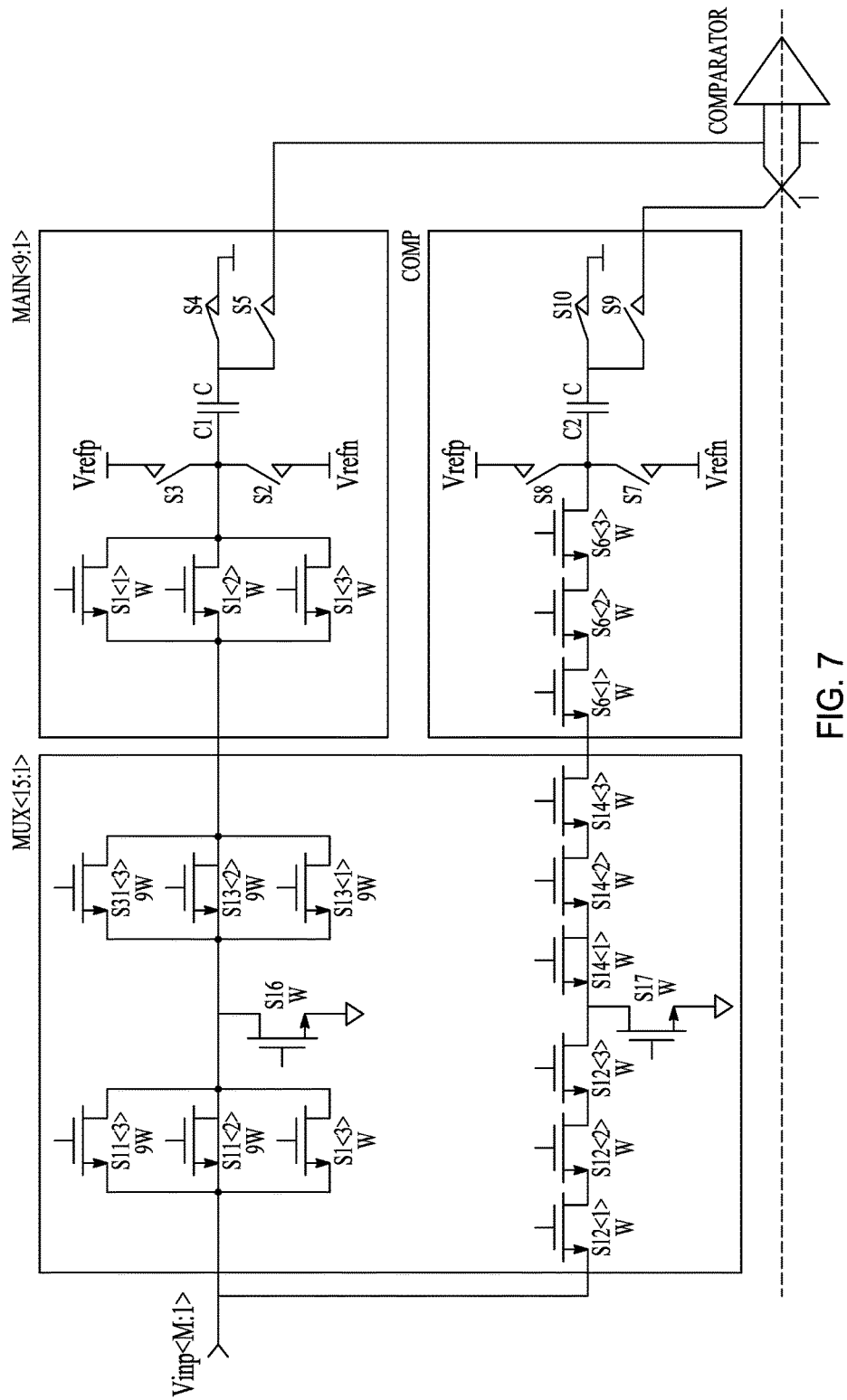
FIG. 7 is a circuit diagram of a second example of a multiplexer and sample and hold circuit.

As an aside or addition to the example embodiments, FIG. 7 also shows a further example of a combined MUX and ADC, but in this case each channel of the MUX is constructed as a T switch with a node between the MUX input and output switchable to an AC ground. This is a technique to reduce coupling between the MUX input of turned off channels and the MUX output.

Several example parameter value sets which meet the above equations of the example embodiments will now be described.

In more detail, the table below gives example values that meet the above equations 1 to 3, and 1' to 3'. In this respect, equations 1 to 3 constitute a first set of simultaneous equations in respect of the first variant of each example described above, whereas equations 1' to 3' represent a second set of simultaneous equations for the second described variant of each example. Two example solutions sets are then given to illustrate that there are multiple solution sets that may be used, with a first example solution set "Example 1" being found for the case where M=16 (i.e. there are 16 MUX channels), and the second example solution set "Example 2" being found for the case where M=8 (i.e. there are 8 MUX channels).

| | First Variant - Eq 1-3 Example 1 | Second variant - Eq 1'-3' Example 1 | First Variant - Eq 1-3 Example 2 | Second variant - Eq 1'-3' Example 2 |
|---|---|---|---|---|
| Number of MUX channels (M) | 16 | 16 | 8 | 8 |
| J | 36 | 36 | 16 | 16 |
| K | 4 | 4 | 1 | 1 |
| A | 1 | 1 | 1 | 1 |
| B | 6 | 6 | 8 | 8 |
| C | 3 | 3 | 4 | 4 |
| D | 2 | 2 | 2 | 2 |
| E | 2 | 2 | 2 | 2 |
| F | 27 | 26 or 27 (26.7, or 27.0) | 64 | 64 or 65 (65.5, 63.8) |

-continued

| | First Variant - Eq 1-3 Example 1 | Second variant - Eq 1'-3' Example 1 | First Variant - Eq 1-3 Example 2 | Second variant - Eq 1'-3' Example 2 |
|---|---|---|---|---|
| G | 6 | 6 | 8 | 8 |
| H | 1 | 1 | 1 | 1 |
| L | 30 | 44 (44.4) | 21 | 28 (27.8) |

In the first variant (using Eq. 1-3) the parameter values work out as integer values. With the second variant (using Eq 1' to 3'), however, occasionally non-integer solutions are obtained from some parameters For example, for the second variant, Example 1 above, equation 1' gives a value for F of 26.7 while equation 3' gives a value of 27.0. In practice a value of either 26 or 27 works very well. Note that except for L, the values for the first and second variants are very similar.

In summary, therefore, several different error compensation mechanisms, that can compensate for distortions in a combined MUX and sample and hold circuit, are described. Firstly, distortion resulting from the on-resistance Ron of the combined MUX switches and input switches of the sample and hold circuit can be compensated, by scaling the widths (or effective widths of series/parallel devices) of the MUX and sample and hold circuit switches in the Comp and Main channels by a ratio equal to the ratio of the size of the Comp to Main sampling capacitors, which in the examples described is the number of compensation channels K to the number of main channels J.

Secondly, distortion arising from the parasitic capacitance of off channels in the MUX can also be compensated for. This is achieved by adding an additional capacitive load to a node in the Comp channel such as the MUX output, which in practice can be embodied by an additional switch of a first width L, the switch being biased off and the width L of the switch being a function of the ratio of the number of main channels J to comp channels K. The additional capacitive load represented by the turned off switch introduces additional error charges into the MUX circuit which can cancel the error charges resulting from the parasitic capacitance of the off channels, thus removing the distortion.

A third technique relates to cancelling distortion that arises in the switches themselves. In such a case a parasitic capacitance arises between the gate and the channel of each FET which during acquisition requires charging to a changing (dynamic) input voltage which leads to small currents flowing through the switches and consequent switch error voltages. In order to address this problem, values can be selected for a number of circuit parameters including the number of devices in the arrays of switches, and the number of main and comp channels, to cause this distortion to cancel.

Figure 17:
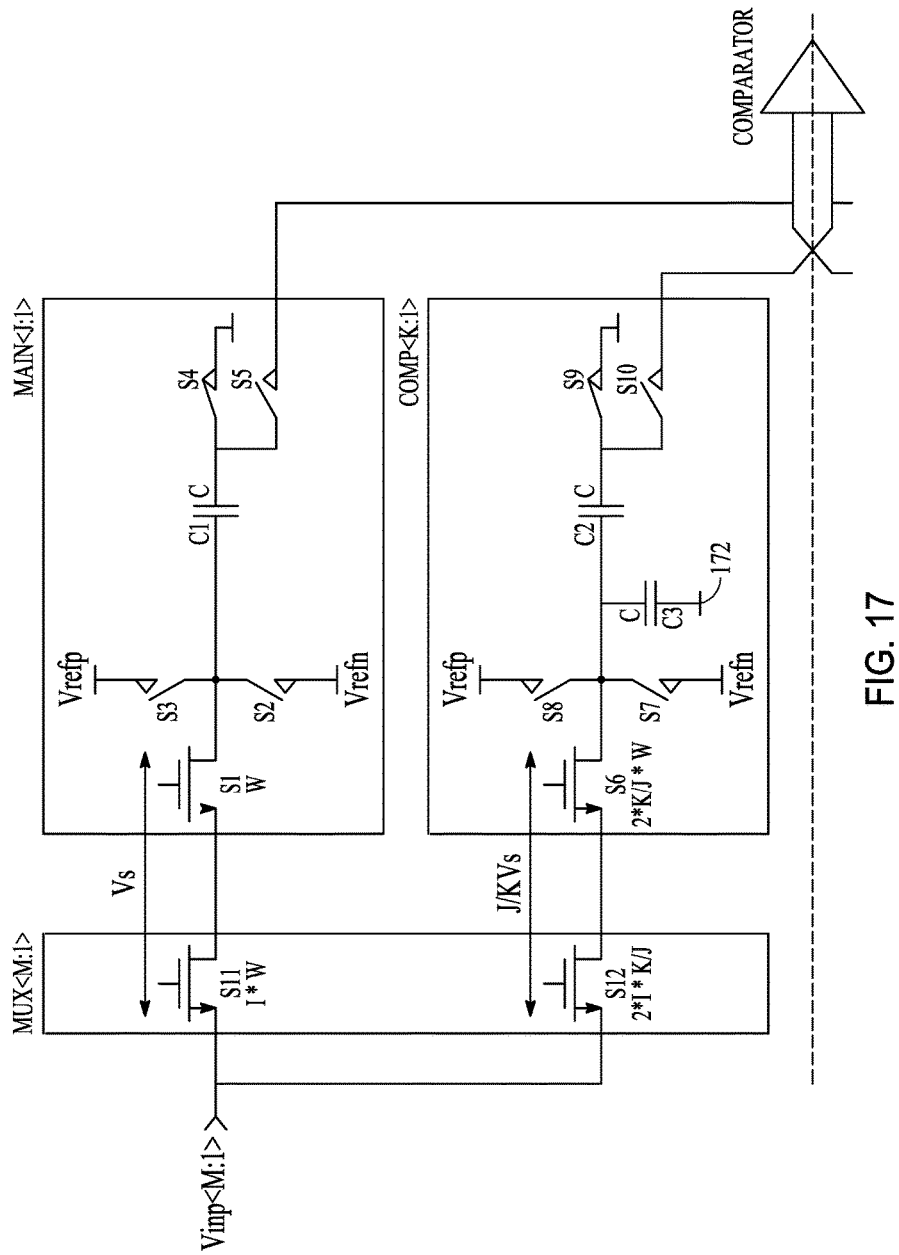
FIG. 17 is a diagram of a further example of the present disclosure.

Various minor modifications may be made to the above described examples to provide further examples. For example, in one further example a loading (rather than sampling) capacitor C3 (172) may be added onto the compensation channel, as shown in FIG. 17. If for example this is the same size as the sampling capacitor then the switch impedance from the input of the compensation channel sample and hold circuit onto the compensation channel sampling capacitor could be halved. This is another way of getting the error voltages to scale appropriately.

In addition, as another example modification, in the above examples the error voltages from the main and compensation channel sampling capacitors are fed to a comparator where they are subtracted one from the other to provide for error cancellation. A comparator is a form of differencing circuit that finds a difference between two input signals. In other examples the comparator may be replaced by any other type of differencing circuit, such as, for example, a differential amplifier, or the like.

In a further modification to provide a further example, instead of providing specific input compensation switches S12 as used in the above described examples, in other examples the compensation switches S12 are combined with the input switches S6 of the compensation channel of the sample and hold circuit, for example by increasing the width or otherwise modifying some other property or characteristics of the sample and hold compensation channel input switches S6. The resulting modified switch S6 should provide the equivalent effect as original switches S12 and S6 in terms of causing compensation errors to be generated in the compensation channel to cancel switch on errors generated in the main channel.

Various further modifications, whether by way of addition, deletion, or substitution may be made to above mentioned examples to provide further examples, any and all of which are intended to be encompassed by the appended claims.

The invention claimed is:

1. A sampling circuit for sampling signals from multiple inputs, comprising:
   a sample and hold stage comprising main and compensation channels, the main and compensation channels including:
   respective main and compensation input switches thereto;
   a respective main channel sampling capacitor; and
   a respective compensation channel sampling capacitor, and
   wherein the main channel sampling capacitor is distinct from the compensation channel sampling capacitor;
   a multiplexer comprising a plurality of input nodes and a plurality of main switches, the main switches controlling signals in the main channel of the sample and hold stage; and
   one or more compensation switches, the one or more compensation switches controlling signals in the compensation channel of the sample and hold stage;
   wherein corresponding respective properties of the main and compensation switches in the combined MUX and sample and hold circuit are configured such that the same total error charges are generated in the main and compensation channel sampling capacitors.

2. A sampling circuit according to claim 1, configured such that the error charges in use substantially cancel one another.

3. A sampling circuit according to claim 2, and further comprising a differencing circuit configured to receive a first error signal indicative of the total error charge in the main channel sampling capacitor and a second error signal indicative of the total error charge in the compensation channel sampling capacitor, and to subtract one of the first or second error signals from the other to generate a substantially error free output signal.

4. A sampling circuit according to claim 1, wherein the corresponding respective properties of the main and compensation switches in the combined MUX and sample and hold circuit are configured such that the respective properties are related to each other in dependence on a first predetermined ratio.

5. A sampling circuit according to claim 4, wherein the first predetermined ratio is one of:
   i) the number of compensation channels K in the sample and hold stage to the number of main channels J in the sample and hold stage; or
   ii) the total value of the sampling capacitor K in the main channel to the total value of the sampling capacitor J in the compensation capacitor.

6. A sampling circuit according to claim 4, wherein the switches comprise transistors, and the corresponding respective properties are the transistor widths or in the case where series and/or parallel arrangement of switches are employed, the effective width, the widths or effective widths of the respective transistors forming the compensation switches in the sample and hold stage and the multiplexer being scaled with respect to the respective transistors forming the main switches in the sample and hold stage and the multiplexer by the first predetermined ratio.

7. A sampling circuit according to claim 1, wherein the one or more compensation switches are provided by configuring switches already provided in the compensation path of the sample and hold stage.

8. A sampling circuit according to claim 1, wherein the respective main and compensation input switches in the sample and hold circuit and the respective main and compensation switches in the multiplexer are formed from respective arrays of switches.

9. A sampling circuit according to claim 8, wherein the arrays of switches are arrays of transistors, the numbers of transistors in the arrays being selected to meet a predetermined relationship for cancellation of distortion due to on resistance of the transistors.

10. A sampling circuit according to claim 8, wherein the arrays of switches are arrays of transistors, the numbers of transistors in the arrays being selected to meet a predetermined relationship for cancellation of distortion due to current flows into parasitic capacitance between respective gates and channels of the transistors.

11. A sampling circuit according to claim 1, and further comprising a capacitive load on the output of the one or more compensation switches or elsewhere in the compensation channel, the capacitive load being of such a value that in use the capacitive load introduces additional error voltages that cancel error voltages arising from parasitic capacitances arising in switches in the multiplexer that are off.

12. A sampling circuit according to claim 11, wherein the capacitive load is one or more transistors biased off.

13. A sampling circuit according to claim 12, wherein the transistor width is adapted to give the desired capacitive load.

14. A sampling circuit according to claim 12, wherein L transistors are provided in parallel to give the desired load.

15. A multiplexing input stage for multiplexing a plurality of signals to at least one output, comprising:
   a multiplexer having a plurality of input nodes and a plurality of main switches arranged to switch a signal presented on the input nodes to a first signal channel, and
   at least one compensation switch, the at least one compensation switch being arranged to switch a signal input thereto to a second signal channel;
   wherein the second signal channel has thereon a capacitive load of such a value that in use the capacitive load introduces additional error voltages that cancel error voltages arising from parasitic capacitances arising in switches in the multiplexer that are off.

16. A multiplexer according to claim 15, wherein the switches in the multiplexer are transmission gates.

17. A multiplexer according to claim 15, wherein the capacitive load is one or more transistors biased off.

18. A multiplexer according to claim 17, wherein the transistor width is adapted to give the desired capacitive load.

19. A multiplexer according to claim 15, wherein L transistors are provided in parallel to give the desired load.

20. A method for sampling signals from multiple input nodes, comprising:
   multiplexing signals from a plurality of input nodes to a sample and hold circuit stage via a plurality of multiplexer switches, the sample and hold stage comprising main and compensation channels, the main and compensation channels including respective main and compensation input switches thereto, and respective main and compensation channel sampling capacitors;
   in the sample and hold stage, switching, via the main and compensation input switches, input signals onto the main and compensation channel sampling capacitors for sampling; and
   sampling the input signals from the main and compensation channel sampling capacitors
   wherein corresponding respective properties of the multiplexer switches and the main and compensation input switches in the combined MUX and sample and hold circuit are configured such that the same total error charges are simultaneously generated in a first sampling capacitor of the main and compensation channel sampling capacitors and in a second sampling capacitor of the main and compensation channel sampling capacitors; and
   wherein the first sampling capacitor is distinct from the second sampling capacitor.

21. The method of claim 20, including subtracting a voltage of the compensation channel sampling capacitors from a voltage of the main channel compensation sampling capacitors.

22. The method of claim 20, wherein the multiplexing signals includes charging a main capacitive load and a compensation capacitive load coupled at an input of the main and compensation channels of the sample and hold stage.

23. A sampling circuit for sampling signals from multiple inputs, the sampling circuit comprising:
   a sample and hold circuit comprising:
      a main sampling capacitor;
      an error compensation sampling capacitor;
   a multiplexer configured to receive a plurality of input signals and to provide a single output signal, the multiplexer including a plurality of main switches for routing a selected input signal as the output signal of the multiplexer for sampling onto the main sampling capacitor; and
   a single compensation switch circuit configured to receive the output signal of the multiplexer for sampling onto the error compensation capacitor; and
   a comparator configured to subtract a voltage of the error compensation sampling capacitor from a voltage of the main sampling capacitor, and to provide a compensated representation of the selected input signal.

24. The sampling circuit of claim 21, including a compensation channel capacitive load coupled between an output of the single compensation switch circuit and ground.

25. The sampling circuit of claim 22, wherein the single compensation channel capacitive load is configured to compensate for distortion associated with parasitic capacitance of a second plurality of main switches of the plurality of main switches in an off-state.

26. The sampling circuit of claim 25, wherein the single compensation channel capacitive load is one or more transistors biased off.

27. The sampling circuit of claim 26, wherein a transistor width of the one of more transistors is adapted to give a desired capacitive load of the single compensation channel capacitive load.

28. A sampling circuit according to claim 1, wherein the main and compensation channels of the sample and hold stage includes at least one main channel and a single compensation channel.

29. The method of claim 22, wherein the changing the compensation capacitive load includes inducing an error compensation voltage across the compensation capacitive load.

30. The method of claim 29, including subtracting the error compensation voltage from a voltage of the main channel compensation sampling capacitors.

31. The method of claim 30, wherein the error compensation voltage is configured to compensate for non-linear parasitic capacitances of off-channels of the multiplexer.

\* \* \* \* \*